(12) United States Patent
Tanabe et al.

(10) Patent No.: US 9,344,073 B2
(45) Date of Patent: May 17, 2016

(54) SEMICONDUCTOR DEVICE

(71) Applicant: FUJITSU LIMITED, Kawasaki-shi, Kanagawa (JP)

(72) Inventors: Satoshi Tanabe, Kawasaki (JP); Kenichi Kawasaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/569,449

(22) Filed: Dec. 12, 2014

(65) Prior Publication Data

US 2015/0171844 A1    Jun. 18, 2015

(30) Foreign Application Priority Data

Dec. 16, 2013   (JP) ................................ 2013-259107

(51) Int. Cl.
  *G05F 1/10*   (2006.01)
  *H03K 5/08*   (2006.01)
  *H03K 19/00*  (2006.01)

(52) U.S. Cl.
  CPC .............. *H03K 5/08* (2013.01); *H03K 19/0008* (2013.01)

(58) Field of Classification Search
  CPC ..................................................... H03K 3/011
  USPC .......... 372/323, 538–544; 327/323, 538–544; 365/226, 194
  See application file for complete search history.

(56) References Cited

U.S. PATENT DOCUMENTS

| 8,694,808 | B2* | 4/2014 | Zhu | ........................... G06F 1/26 713/300 |
| 2002/0138169 | A1* | 9/2002 | Sakaguchi | ............. G06Q 10/06 700/108 |
| 2012/0204047 | A1* | 8/2012 | Ryoo | .................... G06F 1/3203 713/323 |

FOREIGN PATENT DOCUMENTS

| JP | 08-272491 A   | 10/1996 |
| JP | 2003-115750 A | 4/2003  |
| JP | 2003-194858 A | 7/2003  |
| JP | 2010-098202 A | 4/2010  |

OTHER PUBLICATIONS

Fuketa, et al., "12.7-times Energy Efficiency Increase of 16-bit Integer Unit by Power Supply Voltage (VDD) Scaling from 1.2V to 310mV Enabled by Contention-less Flip-Flops (CLFF) and Separated VDD between Flip-Flops and Combinational Logics," 2011 IEEE, pp. 163-168.

Muramatsu, et al., "12% Power Reduction by Within-Functional-Block Fine-Grained Adaptive Dual Supply Voltage Control in Logic Circuits with 42 Voltage Domains," 2011 IEEE, pp. 191-194.

* cited by examiner

*Primary Examiner* — Dinh Le
(74) *Attorney, Agent, or Firm* — Arent Fox LLP

(57) ABSTRACT

A semiconductor device includes: a power supply; a circuit block that has at least one storage element and operates by receiving a power supply voltage from the power supply; a power management unit that controls the power supply to change the power supply voltage; and a storage element monitor circuit that generates a first malfunction signal at a first margin voltage that is higher than a voltage at which the storage element does not normally operate in a case where the power supply voltage lowers, wherein the power management unit controls the power supply so that the power supply voltage does not become lower than the first margin voltage.

9 Claims, 25 Drawing Sheets

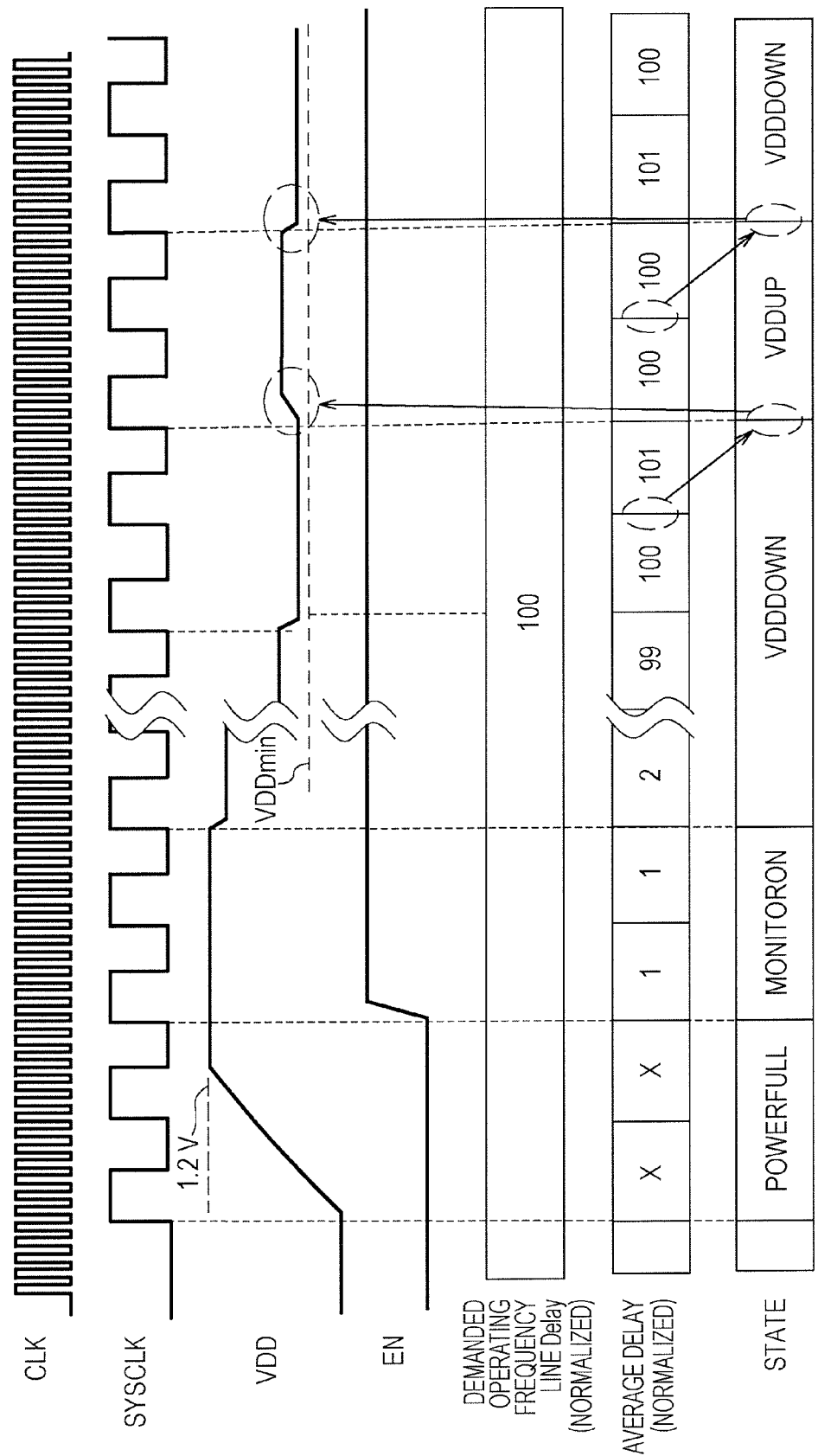

SEMICONDUCTOR DEVICE

CROSS-REFERENCE TO RELATED APPLICATION

This application is based upon and claims the benefit of priority of the prior Japanese Patent Application No. 2013-259107, filed on Dec. 16, 2013, the entire contents of which are incorporated herein by reference.

FIELD

The embodiments discussed herein are related to a semiconductor device.

BACKGROUND

In recent years, reduced power consumption of a semiconductor device (LSI) has been further strongly demanded. Accordingly, power consumption is reduced by lowering an operating frequency in a case where a load decreases. Further, it is desired that power consumption is reduced with satisfaction of demanded performance in spite of manufacturing variability, temperature change, and so forth.

For example, in a case where a threshold value (Vth) of a transistor increases due to the manufacturing variability, an operation rate of the transistor becomes slow, and a signal propagation delay of a circuit increases. Thus, it is desired that a high power supply voltage VDD is set to decrease the delay so that a demanded operating frequency is satisfied.

On the other hand, in a case where the threshold value (Vth) of the transistor decreases due to the manufacturing variability, the operation rate of the transistor becomes fast, and a leakage current amount of the circuit increases, resulting in an increase in energy consumption. Thus, it is desired that a low power supply voltage VDD is set to reduce the energy consumption of the circuit to a limit in which the demanded operating frequency is satisfied in spite of the delay.

Accordingly, a power supply voltage is controlled in accordance with the operating frequency, the manufacturing variability, and the temperature change, and energy consumption per performance is thereby reduced while demanded performance is satisfied. This is referred to as an adaptive voltage scaling (AVS) power management technology.

There are cases where the AVS power management technology is applied to the entire circuit of the semiconductor device and where the semiconductor device is divided into a plurality of circuit blocks and control of power supplies to the circuit blocks is performed while including distribution of loads to the circuit blocks. In order to control the power supplies to the circuit blocks, independent power supplies are provided for the circuit blocks, and at least one of the circuit blocks individually controls the power supply voltage. In the following description, a description will be made about a case where the AVS power management technology is applied to the entire circuit or the single circuit block.

In a common AVS management technology, the power supply voltage is lowered as much as possible in a range in which the circuit blocks normally operate. A determination of whether or not the circuit normally operates is made by measuring the delay of the circuit, for example. In general, the delay of the circuit is measured by providing a delay monitor circuit that has a ring oscillator and a counter and measuring a change in a frequency of the ring oscillator that changes in accordance with the power supply voltage by counting a change in an output signal. Then, a determination is made whether or not the delay that is obtained from a count value is smaller than the delay with which the demanded operating frequency is satisfied.

Examples of related art are Japanese Laid-open Patent Publication Nos. 2003-115750, 08-272491, 2003-194858, and 2010-098202; Muramatsu Atsushi, et al., "12% Power Reduction by Within-Functional-Block Fine-Grained Adaptive Dual Supply Voltage Control in Logic Circuits with 42 Voltage Domains", ESSCIRC, 2011; and Fuketa Hiroshi, et al., "12.7-times energy efficiency increase of 16-bit integer unit by power supply voltage (VDD) scaling from 1.2 V to 310 mV enabled by contention-less flip-flops (CLFF) and separated VDD between flip-flops and combinational logics", International Symposium, pp. 163-168, ISLPED, 2011.

It has been known that when the power supply voltage reaches a very low voltage area (0.5 V or lower), an influence of local variation (random variation) of the threshold value Vth of the transistor becomes more significant and increases a possibility that a flip-flop does not operate (malfunctions) in an individual cell. However, an above method that uses the delay monitor circuit may not detect a phenomenon in which the flip-flop malfunctions at a low power supply voltage. On the other hand, in a case where the power supply voltage is low, an acceptable delay becomes large because the operation rate of the circuit is slow.

Thus, there is a case where the power supply voltage lowers to a voltage at which the circuit does not operate when the demanded operating frequency lowers (for example, several hundred kHz or lower) in a semiconductor device that uses the AVS power management technology by using the delay monitor circuit.

SUMMARY

According to an aspect of the invention, a semiconductor device includes: a power supply; a circuit block that has at least one storage element and operates by receiving a power supply voltage from the power supply; a power management unit that controls the power supply to change the power supply voltage; and a storage element monitor circuit that generates a first malfunction signal at a first margin voltage that is higher than a voltage at which the storage element does not normally operate in a case where the power supply voltage lowers, wherein the power management unit controls the power supply so that the power supply voltage does not become lower than the first margin voltage.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 6 is a timing diagram in a case where an operation rate of a transistor is fast in the semiconductor device to which the AVS power management technology is applied and the semiconductor device operates without restricting the VDD to the VDDmin or higher;

FIG. 24A-24B illustrate input and output signals and an operation of a replica counter and a malfunction counter, in which FIG. 24A illustrates the input and output signals and FIG. 24B is a timing diagram that illustrates an operation;

DESCRIPTION OF EMBODIMENTS

A common power management technology will be described before embodiments are described.

Figure 1:
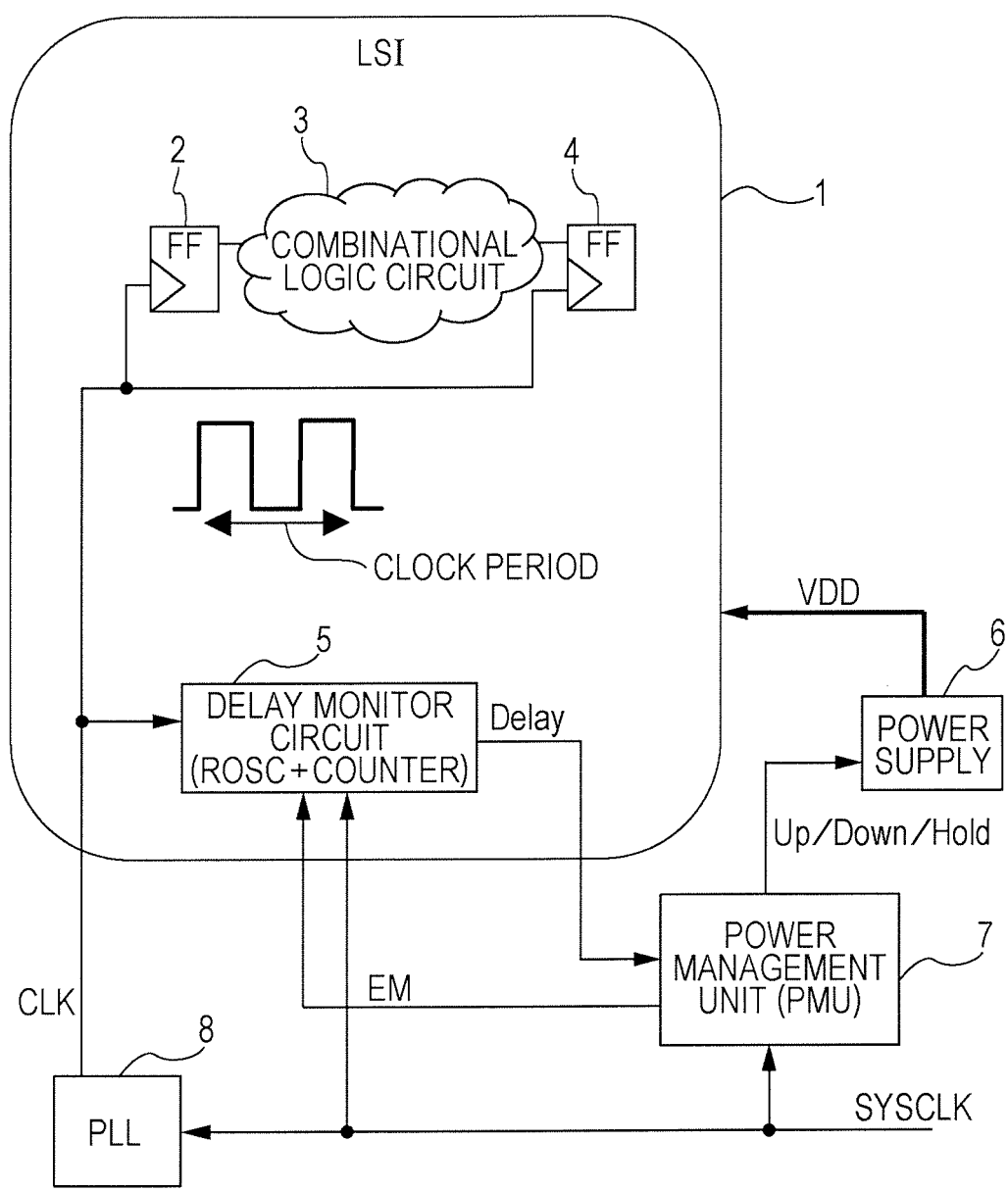
FIG. 1 illustrates a schematic configuration of a semiconductor device in which an AVS technology is applied to a single power supply that supplies a power supply voltage to an entire circuit.

FIG. 1 illustrates a schematic configuration of a semiconductor device in which an AVS technology is applied to a single power supply that supplies a power supply voltage to an entire circuit.

The semiconductor device has a circuit block 1, a power supply 6, a power management unit (PMU) 7, and a phase locked loop (PLL) 8. Although there is a configuration in which the power supply 6, the PMU 7, and the PLL 8 are provided outside an LSI and only the circuit block 1 is provided in the LSI, configurations that include such a case are also referred to as the semiconductor device.

The power supply 6 supplies a power supply voltage VDD to the circuit block 1 and so forth (including the PMU 7 and the PLL 8). The power supply 6 changes the power supply voltage VDD in accordance with a command from the PMU 7. The PMU 7 receives a system clock SYSCLK that is externally supplied (or separately generated internally), receives information about a delay from the delay monitor circuit 5 that will be described later, and outputs a power management signal (Up, Down, or Hold) to control the power supply voltage VDD that is output by the power supply 6. The PMU 7 further controls an operation state of the delay monitor circuit 5. Although not illustrated, the PMU 7 receives information about a load state of the semiconductor device in some manner and controls the power supply 6 in accordance with the information. The PLL 8 generates an internal clock CLK from the system clock SYSCLK and supplies the internal clock CLK to the circuit block 1. Although not illustrated, the PLL 8 receives a command about a frequency of the internal clock CLK in some manner (for example, from the PMU 7) and generates the internal clock CLK of a frequency of the command.

The circuit block 1 has a large number of circuit elements that include a flip-flop (FF) 2, a combinational logic circuit 3, and an FF 4. The FF 2 synchronously operates with the internal clock CLK that is supplied from the PLL 8, and outputs a signal from another circuit portion or from the outside to the combinational logic circuit 3 synchronously with the internal clock CLK. The combinational logic circuit 3 receives signals from the FF 2 and an FF that is not illustrated, performs a logical operation, and outputs the signals to the FF 4. The FF 4 synchronously operates with the internal clock CLK, and outputs a signal from the combinational logic circuit 3 to another circuit portion or the outside synchronously with the CLK.

The circuit block 1 is formed with a ring oscillator and a counter and has the delay monitor circuit 5 that receives the system clock SYSCLK and the internal clock CLK and generates a delay of the circuit in a case where an operation is performed at the power supply voltage VDD. An examination for a delay of a circuit (transistor) with which the circuit block 1 does not malfunction and normally operates is in advance performed, and a delay of the delay monitor circuit 5 that corresponds to the delay is set. An operation state (On or Off) of the delay monitor circuit 5 is controlled in accordance with a control signal EN from the PMU 7.

The PMU 7 receives the information about the load state of the semiconductor device and controls the power supply 6 so that the power supply voltage VDD lowers as much as possible in a range in which delay information of the delay monitor circuit 5 satisfies a preset condition.

Figure 2:
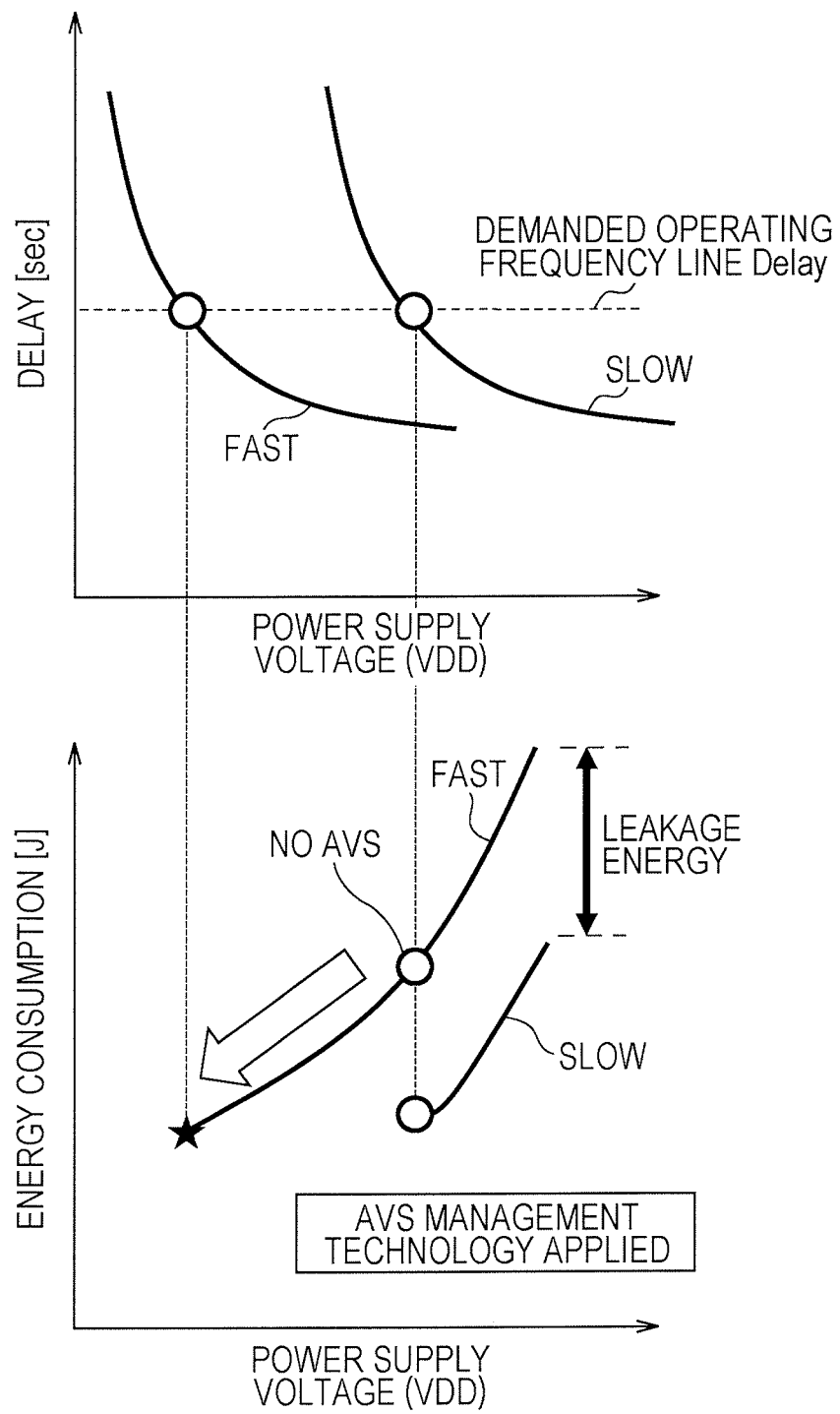
FIG. 2 explains control of the single power supply illustrated in FIG. 1 in the AVS technology.

FIG. 2 explains control of a single power supply illustrated in FIG. 1 in the AVS technology. An upper side of FIG. 2 illustrates a change in a delay of the circuit (transistor) with respect to a change in the power supply voltage VDD and illustrates cases where operation rates of the transistor are slow and fast. A lower side of FIG. 2 illustrates an example of a change in circuit energy consumption with respect to the change in the power supply voltage VDD and illustrates the cases where the operation rates of the transistor are slow and fast. Illustrated curves change also in accordance with a temperature condition.

On the upper side of FIG. 2, the circuit normally operates in a case where the delay is lower than a demanded operating frequency line Delay and malfunctions in a case where the delay is higher than the line. As illustrated, the delay lowers as the power supply voltage VDD lowers. However, the power supply voltage VDD that realizes the demanded operating frequency of the circuit differs between the case where the operation rate of the transistor is slow and the case where the operation rate of the transistor is fast.

In a case where the AVS technology is not applied, in consideration of manufacturing variability, the power supply voltage VDD is set high so that the delay becomes necessarily lower than the demanded operating frequency line Delay even in a case where the operation rate of the transistor is slow. Thus, as illustrated in the lower side of FIG. 2, in a case where a transistor whose operation rate is fast is manufactured, the energy consumption increases because the power supply voltage VDD is set high and a leakage current amount of the circuit increases. In other words, the high power supply voltage VDD is set despite the fact that the energy consumption may be reduced by further lowering the power supply voltage VDD.

As illustrated in the lower side of FIG. 2, in a case where the AVS technology is applied, the delay of an actually manufactured transistor is measured by the delay monitor circuit 5, and the energy consumption is reduced by further lowering the power supply voltage VDD to a limit in a case where the operation rate of the transistor is fast.

Figure 3:
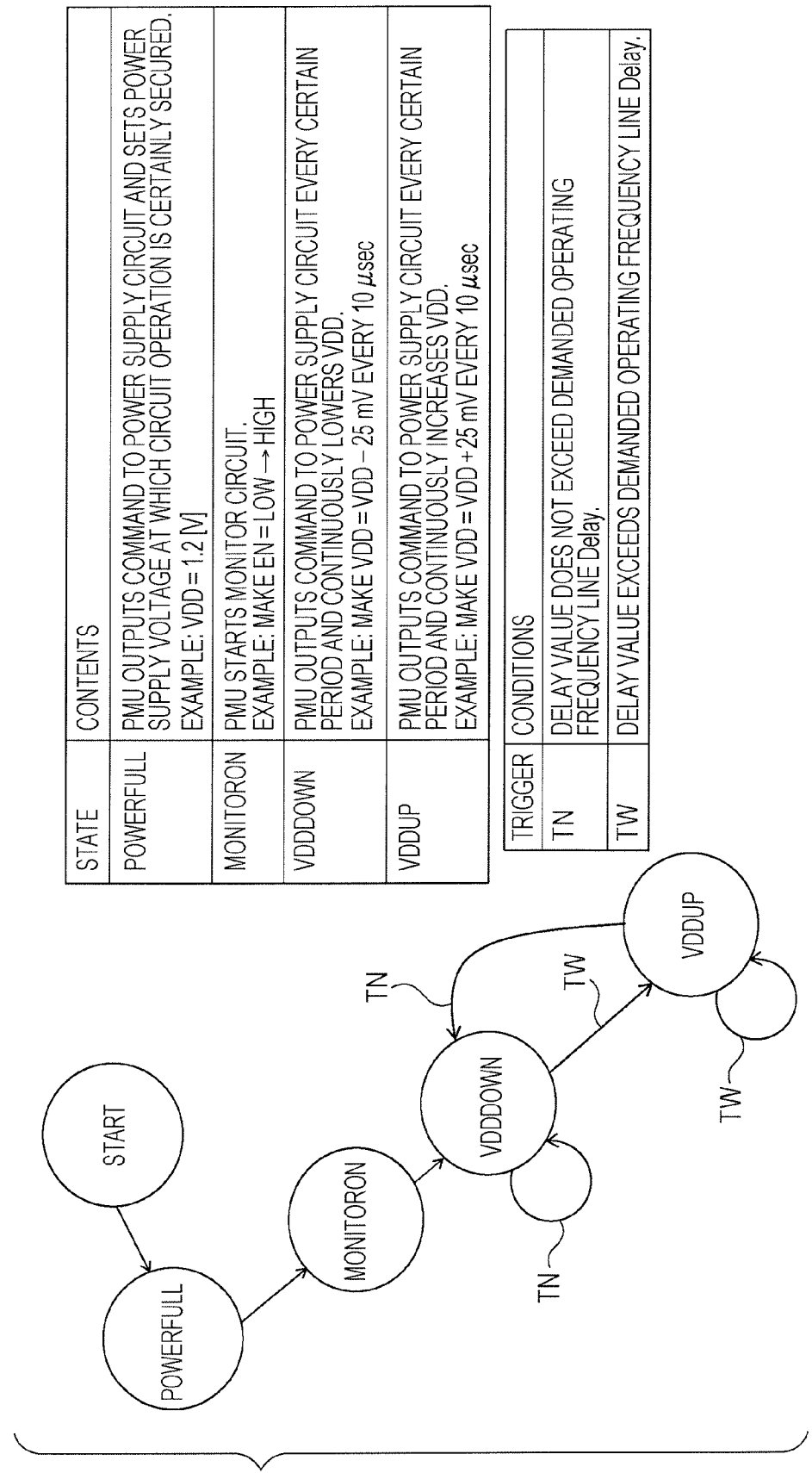
FIG. 3 is an operation state transition diagram that illustrates an operation sequence of the semiconductor device to which the AVS technology is applied.

FIG. 3 is an operation state transition diagram that illustrates an operation sequence of the semiconductor device to which the AVS technology is applied.

As illustrated in FIG. 3, the operation sequence starts from "START" and transits among the states of "POWERFULL", "MONITORON", "VDDDOWN", and "VDDUP". Descriptions of the states and triggers of transition in the states of "VDDDOWN" and "VDDUP" are indicated in a chart of FIG. 3, and descriptions thereof will not be made.

In the AVS technology, the power supply voltage VDD is lowered when the delay is smaller than the limit, and the VDD is increased when the delay becomes greater than the limit.

Figure 4:
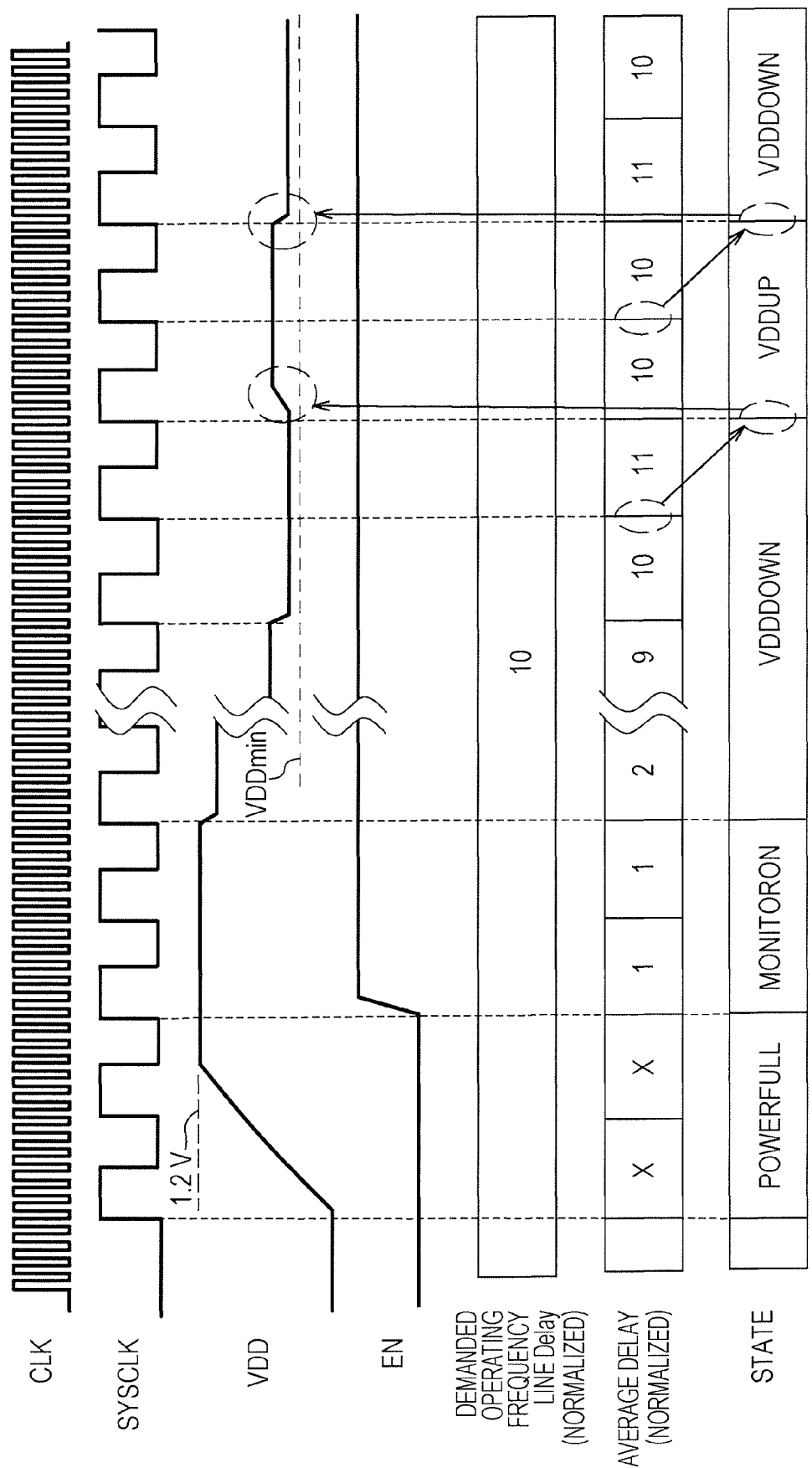
FIG. 4 is a timing diagram that illustrates an operation of the semiconductor device to which the AVS technology is applied.

FIG. 4 is a timing diagram that illustrates an operation of the semiconductor device to which the AVS technology is applied.

The operation starts from "START", and the VDD increases in "POWERFULL" and increases to a maximum value of 1.2 V, for example.

The PMU 7 turns the EN that is output to the delay monitor circuit 5 on (high) in "MONITORON". In response to this, the delay monitor circuit 5 measures and outputs the delay. Here, it is assumed that the delay of a limit line of the demanded operating frequency is "10". The VDD is the maximum value, the delay is thus small, and "1" is output, for example.

Because the delay is lower than the limit line, the state transits to "VDDDOWN", and the VDD is lowered by a unit amount. Repeating this leads to a stepwise increase of the delay, and the delay of the limit line increases (to "11") exceeding "10". In response to this, the state transits to "VDDUP", and the VDD is increased by the unit amount.

Because the VDD increases, the delay again becomes "10", and the state transits to "VDDDOWN". Such an operation is repeated subsequently. Accordingly, the VDD is controlled so that the delay is around the limit line.

The circuit block 1 actually does not normally operate in a case where the delay that is output by the delay monitor circuit 5 is "12", for example. In such a case, the delay of the limit line of the demanded operation frequency is set to "10". Accordingly, malfunction does not occur during the operation.

Figure 5A:
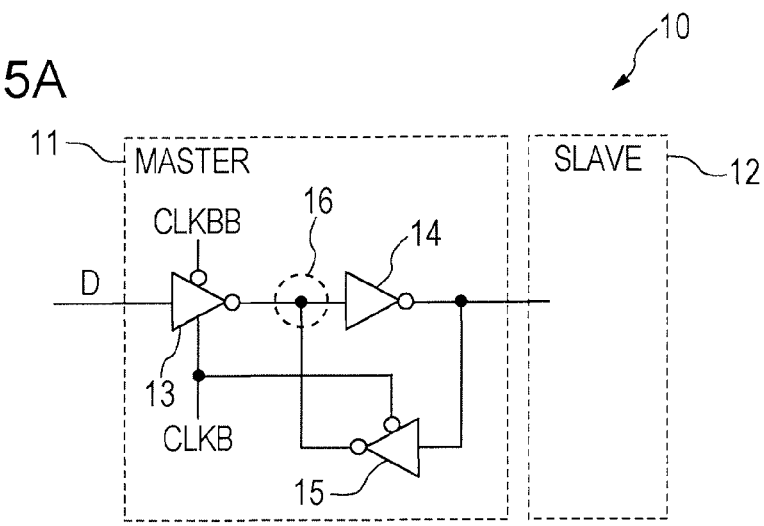
FIG. 5A-5C illustrate a circuit example of a flip-flop (FF) and the relationship between power supply voltage control by an AVS power management technology and a minimum operating voltage VDDmin of the FF.
Figure 5B:
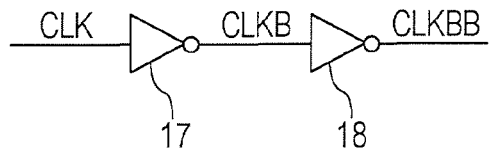
Figure 5C:
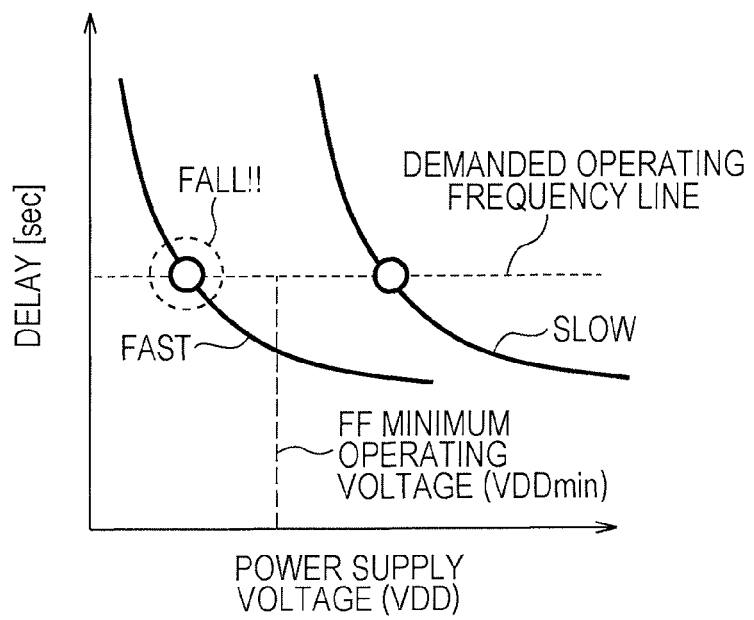

FIG. 5 illustrates a circuit example of the flip-flop (FF) and the relationship between power supply voltage control by an AVS power management technology and a minimum operating voltage VDDmin of the FF. FIG. 5A illustrates a circuit diagram of a tri-state based FF (TBFF), FIG. 5B illustrates a clock generation circuit that makes the TBFF operate, and FIG. 5C illustrates the relationship between the AVS power management technology and the minimum operating voltage VDDmin of the FF. A large number of the FFs are used for the combinational logic circuit or the like although not limited to the TBFF.

The TBFF has a master latch 11 and a slave latch 12. The master latch 11 has inverters 13 to 15 that are connected as illustrated. As illustrated in FIG. 5B, a clock supplied to the inverter 13 and 15 is generated by inputting the internal clock CLK to two inverters 17 and 18 that are serially connected. The master latch 11 and the slave latch 12 have a same configuration. The TBFF has been widely known, and a further description will thus not be made.

In FIG. 5A, outputs of the inverters 13 and 15 are connected in a wired-OR connection at a node that is represented by a reference numeral 16 and become an input to the inverter 14. It is known that when the power supply voltage VDD enters a very low voltage area (for example, 0.5 V or lower), an influence of local variation (random variation) of a threshold value Vth of the transistor becomes more significant, an electric potential of the node 16 becomes insufficient, and malfunction occurs. Thus, when the power supply voltage VDD enters the very low voltage area, a possibility that the flip-flop (FF) does not operate (malfunctions) in an individual cell increases. Here, a limit of the power supply voltage VDD that allows a normal operation of the FF is referred to as FF minimum operating voltage VDDmin.

As illustrated in FIG. 5C, in the AVS power management technology based on the delay, the power supply voltage VDD is lowered in the range in which the delay becomes smaller than the demanded operating frequency line. In a case where the threshold value Vth is of the transistor of the circuit block 1 whose operation rate is slow, the VDD is increased to a certain degree in order to make the delay smaller than the demanded operating frequency line. Thus, the power supply voltage VDD does not lower to the VDDmin, and malfunction of the FF thus does not occur. However, when the threshold value Vth of the transistor of the circuit block 1 is largely offset to the fast side, the power supply voltage VDD may lower to the VDDmin in a state where the delay is smaller than the demanded operating frequency line. In other words, it is insufficient that the power supply voltage VDD is controlled only in accordance with the delay, and control is desired that avoids a case where the power supply voltage VDD becomes lower than the voltage VDDmin at which the FF malfunctions.

FIG. 6 is a timing diagram in a case where the operation rate of the transistor is fast in the semiconductor device to which the AVS power management technology is applied and the semiconductor device operates without restricting the VDD to the VDDmin or higher.

In FIG. 6, it is assumed that the delay of the limit line of the demanded operating frequency is "100". When the VDD is the maximum value (=1.2 V), the delay is small, and "1" is output, for example.

When the state transits to "VDDDOWN" and the VDD is sequentially lowered, the VDD becomes lower than the VDDmin before the delay exceeds "100". The VDD is controlled such that the delay becomes around "100", then the VDD continuously stays lower than the VDDmin, and the FF does not operate.

However, the AVS power management technology that uses the delay monitor circuit may not detect a phenomenon in which the flip-flop malfunctions at the low VDD. Thus, there is a problem that the power supply voltage VDD lowers to a voltage at which the circuit does not operate (malfunctions) when the demanded operating frequency lowers (for example, several hundred kHz or lower) in related art.

A semiconductor device that performs an AVS power management of embodiments described below controls the power supply voltage so that malfunction does not occur and reduces energy consumption.

Figure 7:
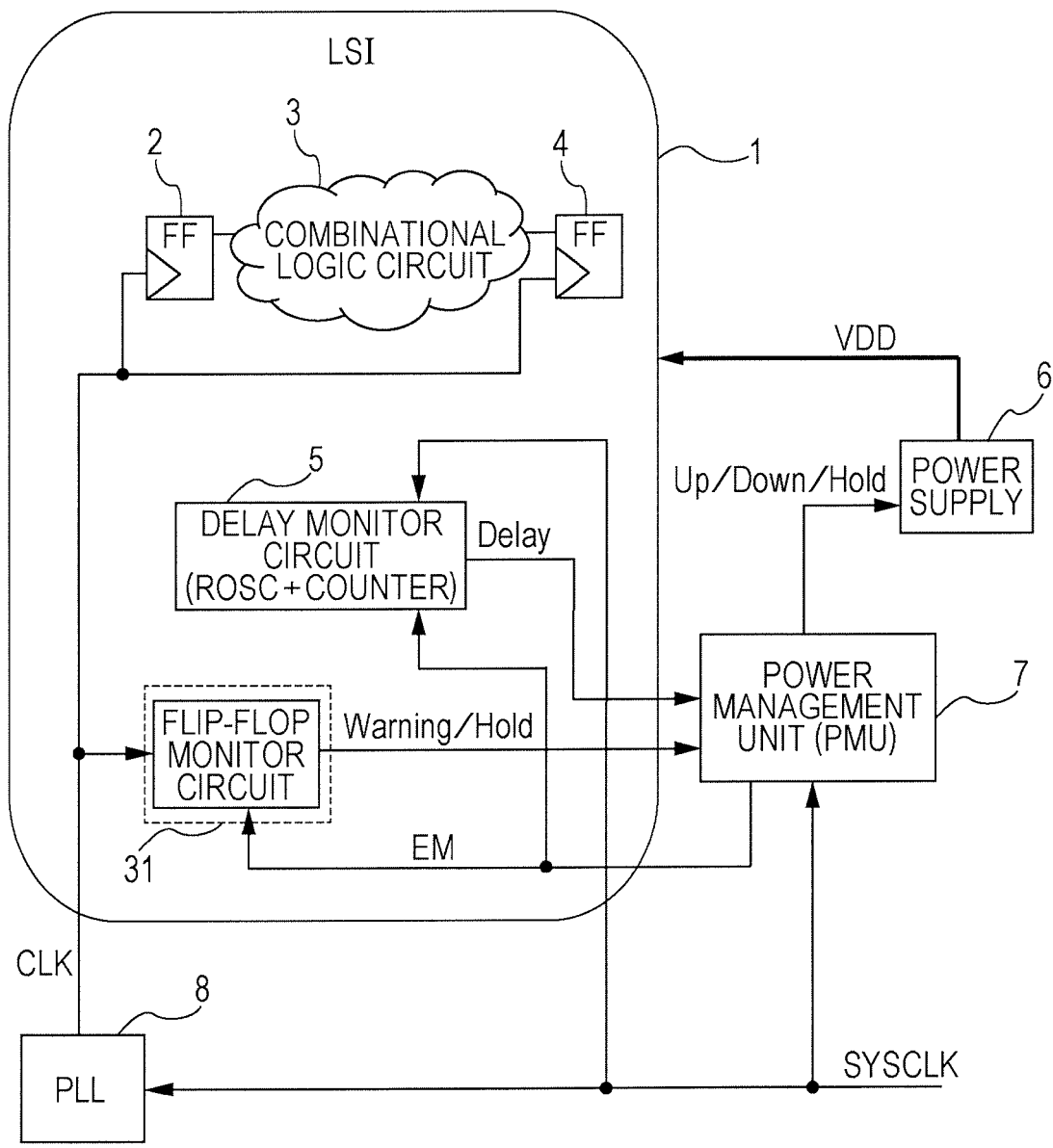
FIG. 7 illustrates a circuit configuration of a semiconductor device of a first embodiment.

FIG. 7 illustrates a circuit configuration of a semiconductor device of a first embodiment.

The semiconductor device of the first embodiment has a power supply in which the power supply voltage is variable. The AVS power management technology is applied to the semiconductor device.

The semiconductor device of the first embodiment has the circuit block 1, the power supply 6, the PMU 7, and the PLL 8.

The circuit block 1 has the FF 2, the combinational logic circuit 3, the FF 4, the delay monitor circuit 5, and a flip-flop (FF) monitor circuit 31.

In other words, the semiconductor device of the first embodiment is different from the above-described semiconductor device illustrated in FIG. 1 in a point that the FF monitor circuit 31 is provided and the PMU 7 uses warning signals Warning and Hold that are output by the FF monitor circuit 31 for control, and the other elements are the same. Thus, a description will be made about the FF monitor circuit 31 and the PMU 7, and a description about the other circuit elements will not be made. The FF monitor circuit 31 outputs the warning signal Warning immediately before the VDD lowers exceeding the FF minimum operating voltage (VDDmin) at which the FF does not operate. Further, an operation state (on or off) of the FF monitor circuit 31 is controlled by the PMU 7.

A description will first be made about generation of the warning signal Warning by the FF monitor circuit 31 and control by using that by the PMU 7.

Figure 8:
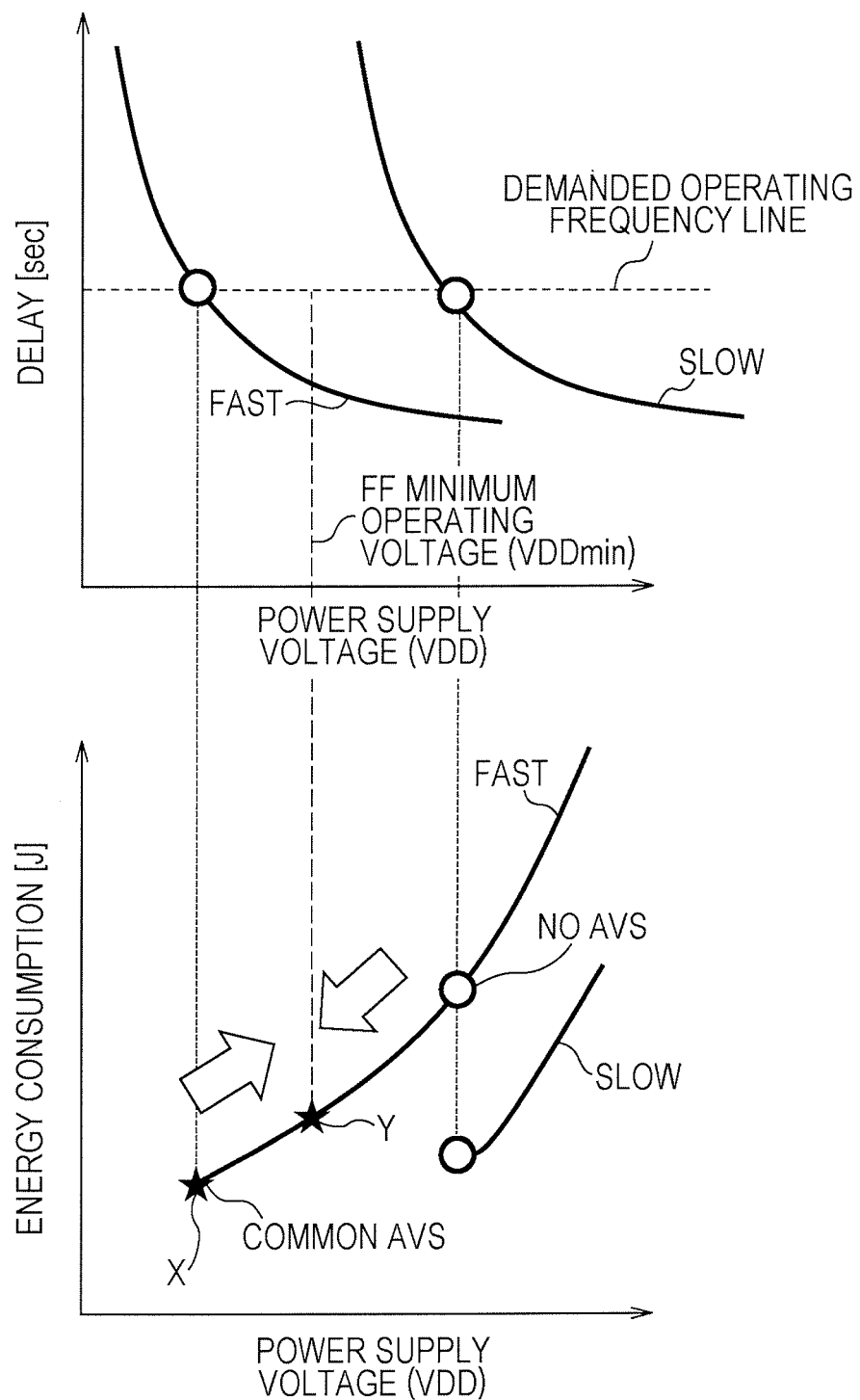
FIG. 8 explains control in the AVS technology that is executed in the first embodiment.

FIG. 8 explains control in the AVS technology that is executed in the first embodiment. An upper side of FIG. 8 illustrates a change in a delay of the circuit (transistor) with respect to a change in the power supply voltage VDD and illustrates cases where operation rates of the transistor are slow and fast. A lower side of FIG. 8 illustrates an example of a change in circuit energy consumption with respect to the change in the power supply voltage VDD and illustrates the cases where the operation rates of the transistor are slow and fast. The upper side of FIG. 8 is the same as FIG. 5B, a range in which the delay is smaller than the demanded operating frequency line and the VDD is higher than the FF minimum operating voltage is an operating range, and control is performed so that the VDD falls within the range. Malfunction of the FF occurs when the VDD becomes lower than the FF minimum operating voltage. Because it is not preferable that the FF malfunctions during the operation, a voltage that is slightly higher than the FF minimum operating voltage is set as a first margin voltage. The FF monitor circuit 31 produces the warning signal Warning when the VDD becomes lower than the first margin voltage.

In the above-described AVS technology of FIG. 5B, as illustrated in the lower side of FIG. 8, the VDD is lowered to a voltage indicated by X in a case where the operation rate of the transistor is fast because the delay is smaller than the demanded operating frequency line even when the VDD is largely lowered. However, the FF does not operate in this state. By contrast, in the first embodiment, when the FF monitor circuit 31 produces the warning signal Warning in a case where the VDD is lowered, that is, when the VDD becomes lower than the first margin voltage (the point indicated by Y in FIG. 8), control is performed such that the VDD is conversely increased by a unit amount. Accordingly, the VDD does not become lower than the FF minimum operating voltage, and the FFs 2 and 4 in the circuit block 1 normally operate.

Summarizing AVS management in the first embodiment, the FF monitor circuit 31 produces the warning signal Warning before the VDD lowers to the FF minimum operating voltage (VDDmin).

Further, the PMU 7 outputs an instruction to make the power supply 6 increase the VDD when the PMU 7 receives the warning signal Warning.

Figure 9:
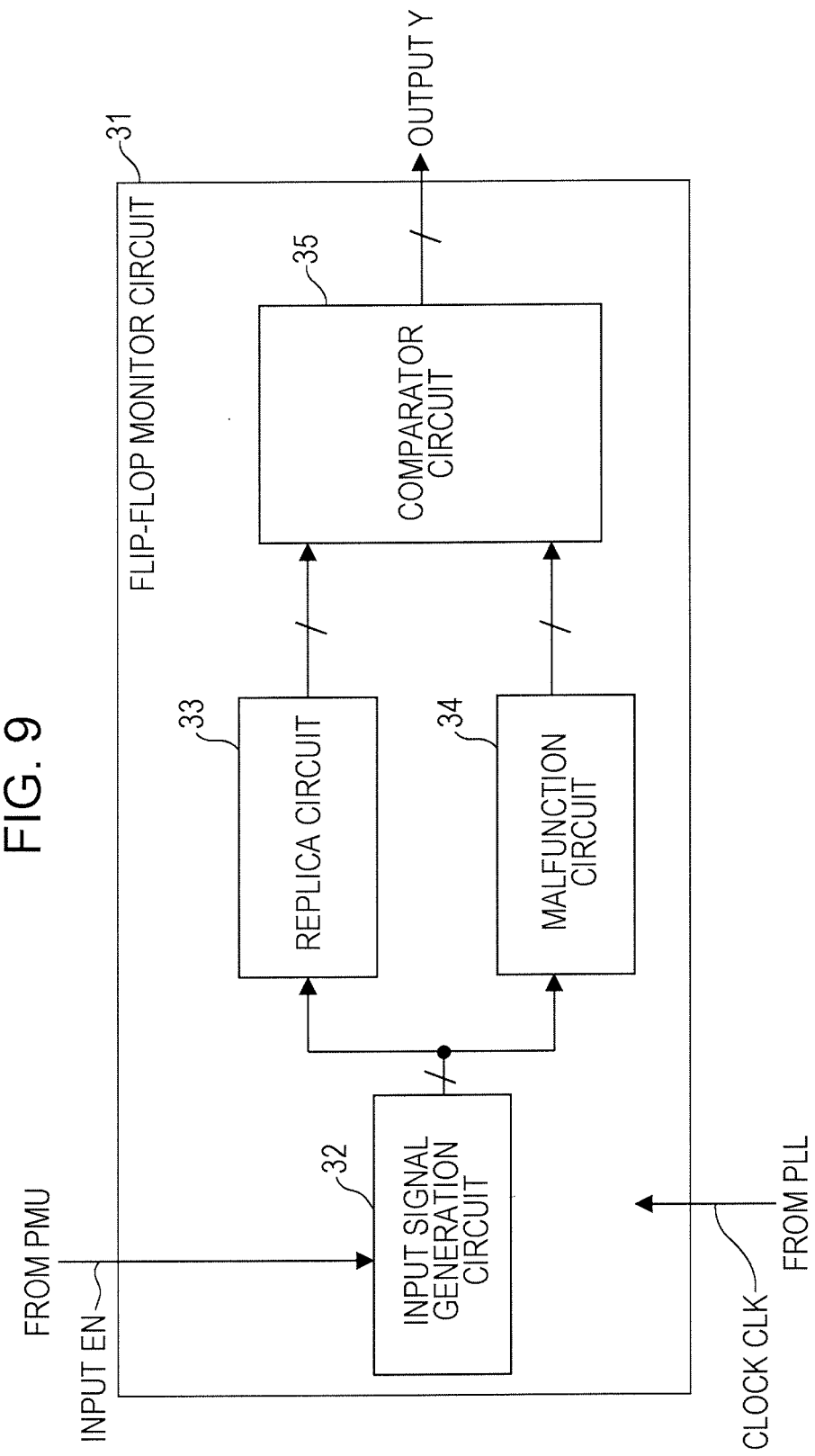
FIG. 9 is a block diagram that illustrates a configuration example of a flip-flop (FF) monitor circuit.

FIG. 9 is a block diagram that illustrates a configuration example of the flip-flop (FF) monitor circuit 31.

The FF monitor circuit 31 has an input signal generation circuit 32, a replica circuit 33, a malfunction circuit 34, and a comparator circuit 35. The input signal generation circuit 32 produces a signal that alternately changes between zero and one when the control signal EN from the PMU 7 is at a high level. The replica circuit 33 is a circuit that has the same circuit configuration and properties as the FF that is illustrated in FIG. 5A and takes in and retains a signal that is input from the input signal generation circuit 32 synchronously with the internal clock CLK. The malfunction circuit 34 has the same circuit configuration as the FF but malfunctions when the power supply voltage VDD becomes lower than the first margin voltage. In other words, the malfunction circuit 34 malfunctions at a higher voltage than a voltage at which the replica circuit 33 malfunctions. The comparator circuit 35 determines whether or not a signal that is output by the replica circuit 33 and alternately changes between zero and one agrees with a signal that is output by the malfunction circuit 34 and alternately changes between zero and one. The replica circuit 33 and the malfunction circuit 34 are the FFs, to which the same signal is input from the input signal generation circuit 32. Thus, the comparator circuit 35 detects agreement in a case where both of the replica circuit 33 and the malfunction circuit 34 normally operate. If an output Y of the comparator circuit 35 indicates disagreement, a determination is made that one of the replica circuit 33 and the malfunction circuit 34 malfunctions and specifically the malfunction circuit 34 that malfunctions at the higher VDD malfunctions.

Figure 10:
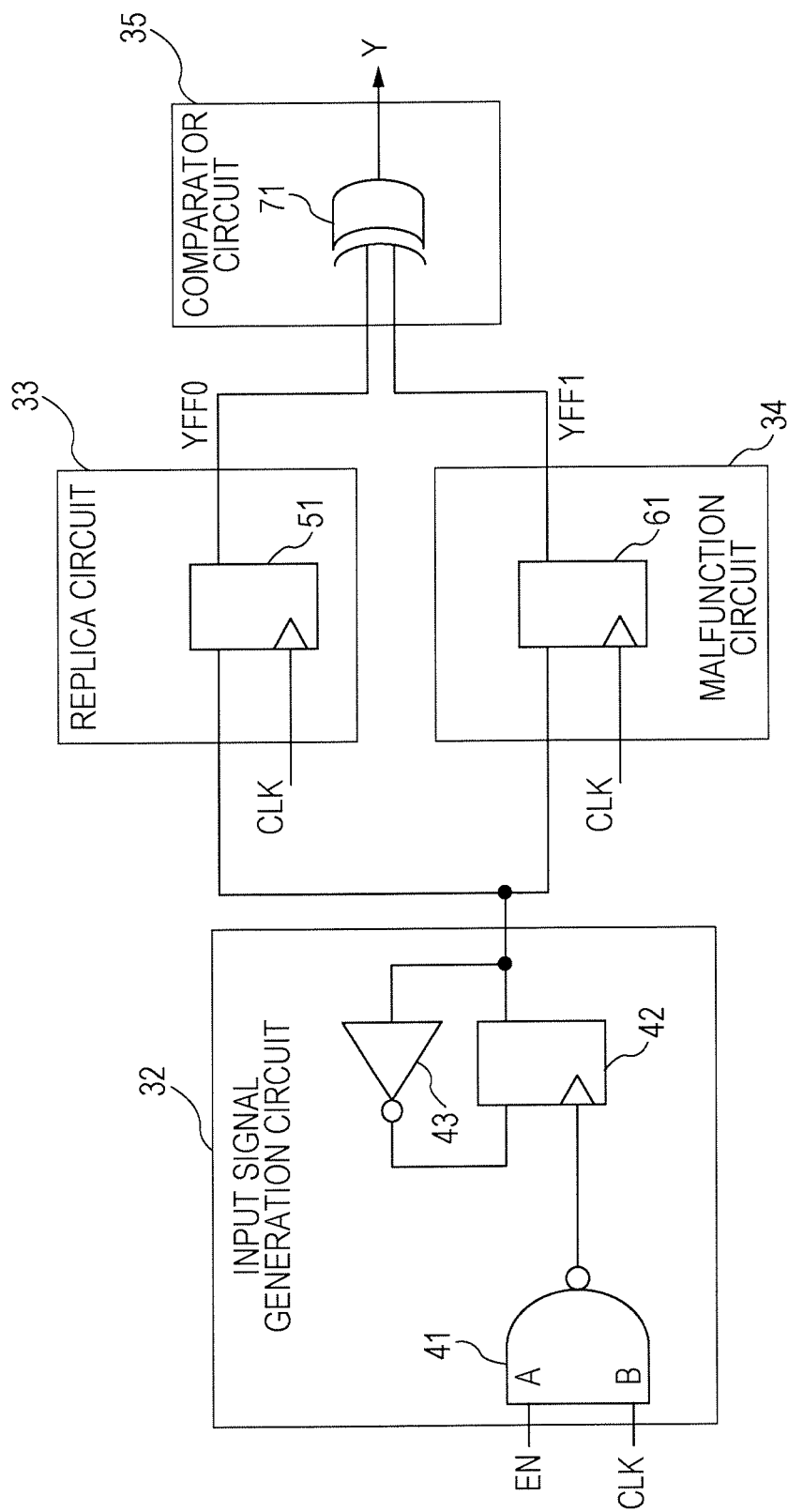
FIG. 10 is a circuit diagram that illustrates a more specific configuration example of the FF monitor circuit.

FIG. 10 is a circuit diagram that illustrates a more specific configuration example of the FF monitor circuit 31.

The input signal generation circuit 32 has a NAND gate 41, an FF 42, and an inverter 43. The NAND gate 41 allows the internal clock CLK from the PLL 8 to pass through when the control signal EN from the PMU 7 is at a high level, blocks the internal clock CLK when the EN is at a low level, and outputs a signal that is fixed at a high level. The FF 42 and the inverter 43 form a ½ frequency divider circuit and outputs a signal in which the frequency of the internal clock CLK is divided into a half when the EN is at a high level.

The replica circuit 33 has an FF 51 that has the same circuit configuration and properties as the FF that is illustrated in FIG. 5A, latches and retains an input signal synchronously with the internal clock CLK, and outputs the signal as YFF0.

The malfunction circuit 34 has an FF 61 that has the same circuit configuration and properties as the FF 51 of the replica circuit 33. The malfunction circuit 34 latches and retains an input signal synchronously with the internal clock CLK and outputs the signal as YFF1 but malfunctions when the VDD becomes lower than the first margin voltage that is higher than the VDDmin. In other words, the FF 61 malfunctions prior to the FF 51 in a case where the VDD is lowered.

The comparator circuit 35 has an exclusive disjunction gate (EXOR) 71 that detects agreement between YFF0 and YFF1. The EXOR 71 outputs a comparison result as Y.

Figure 11:
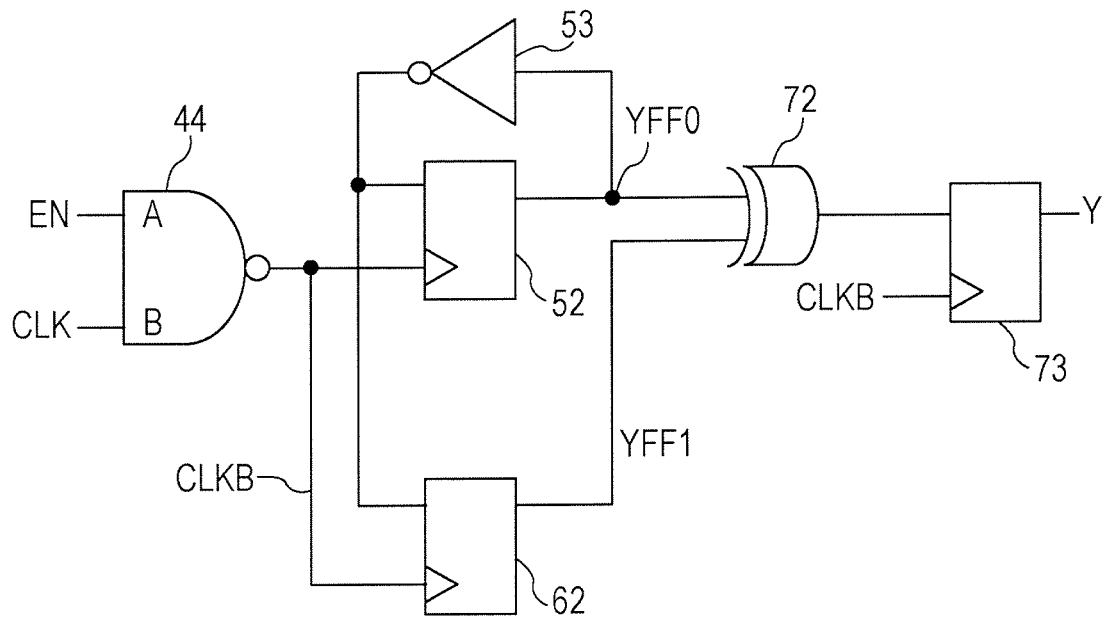
FIG. 11 is a circuit diagram that illustrates another configuration example of the FF monitor circuit.

FIG. 11 is a circuit diagram that illustrates another configuration example of the FF monitor circuit 31.

The FF monitor circuit 31 of FIG. 11 has a NAND gate 44, an FF 52, an inverter 53, an FF 62, an EXOR 72, and an FF 73. The NAND gate 44 gates the internal clock CLK. The FF 52 has the same circuit configuration and properties as the FF that is illustrated in FIG. 5A and forms a ½ frequency divider circuit together with the inverter 53. The FF 62 has the same circuit configuration and properties as the FF 52 and forms a ½ frequency divider circuit together with the inverter 53 but malfunctions when the VDD becomes lower than the first margin voltage that is higher than the VDDmin. An output of the FF 52 is YFF0, and an output of FF 62 is YFF1. The EXOR 72 detects agreement between YFF0 and YFF1. The FF 73 retains a comparison result by the EXOR 72 synchronously with the clock and outputs the comparison result as Y.

The FF monitor circuit 31 of FIG. 11 is a FF monitor circuit that is simplified from the FF monitor circuit 31 of FIG. 10 and has the same function, and a description thereof will not be made. Further, the FF monitor circuit 31 of FIG. 11 is used in a similar manner to the FF monitor circuit 31 of FIG. 10. Thus, a case where the FF monitor circuit 31 of FIG. 10 is used will be described in a description made below.

FIG. 12 illustrates a configuration example of the FF 61 of the malfunction circuit 34. The FF 62 is implemented in the same manner.

Figure 12A:
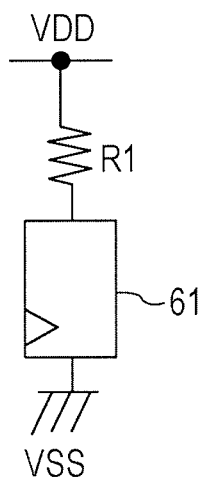
FIG. 12A-12C illustrate a configuration example of the FF in a malfunction circuit.

In FIG. 12A, the FF 61 in the same configuration as the FF 51 is directly connected to a GND but is connected to the VDD via a resistor R1. The power supply voltage supplied to the FF 61 is thereby effectively lowered, and the FF 61 malfunctions when the VDD becomes lower than the first margin voltage that is higher than the VDDmin.

Figure 12B:
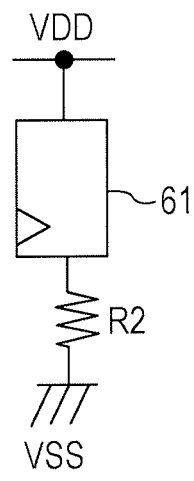

In FIG. 12B, the FF 61 in the same configuration as the FF 51 is directly connected to the VDD but is connected to the GND via the resistor R1. The power supply voltage supplied to the FF 61 is thereby effectively lowered, and the FF 61 malfunctions when the VDD becomes lower than the first margin voltage that is higher than the VDDmin.

Figure 12C:
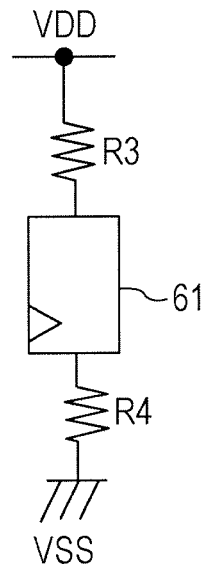

In FIG. 12C, the FF 61 in the same configuration as the FF 51 is connected to the VDD and the GND via resistors R3 and R4. The power supply voltage supplied to the FF 61 is thereby effectively lowered, and the FF 61 malfunctions when the VDD becomes lower than the first margin voltage that is higher than the VDDmin.

Figure 13:
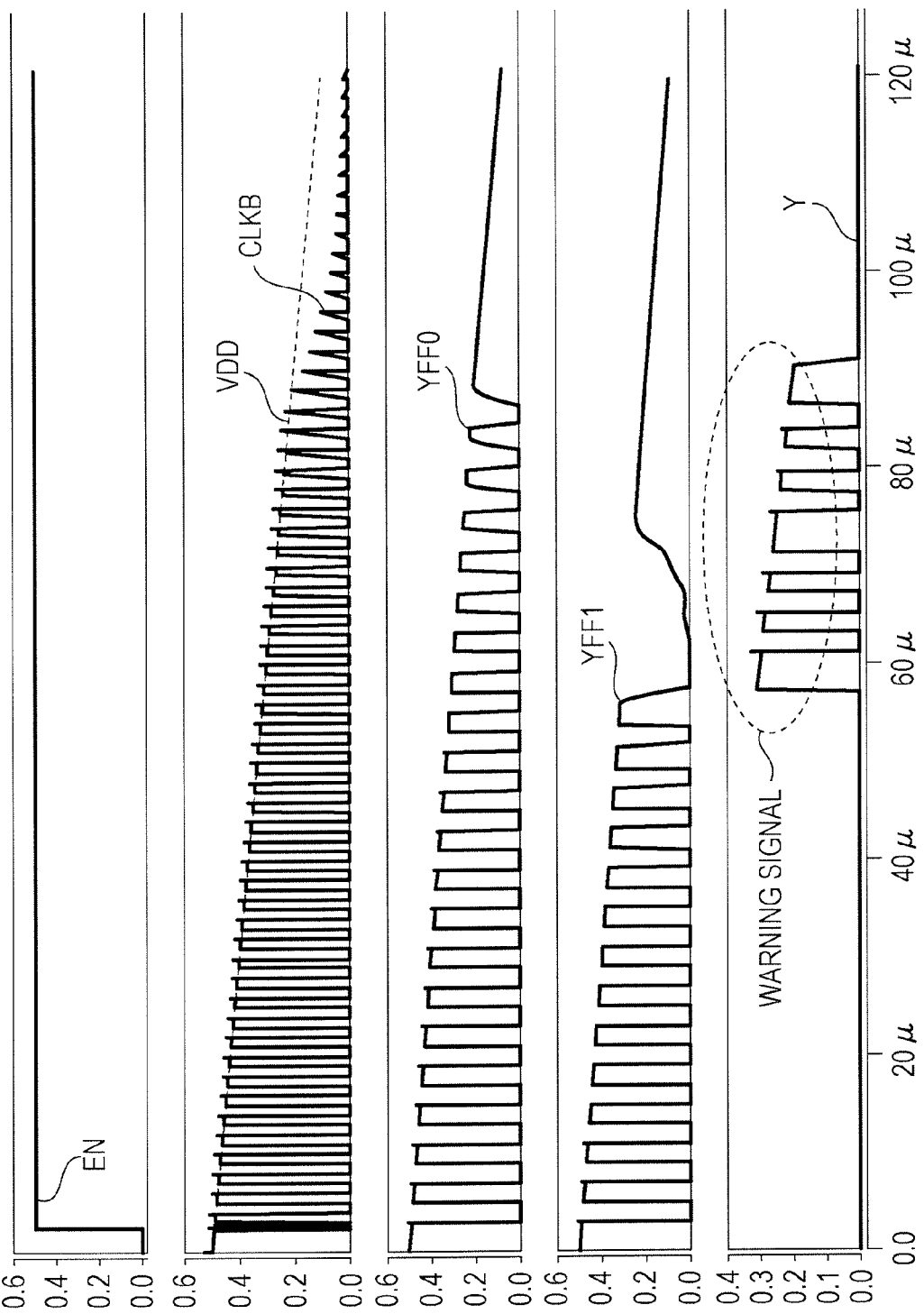
FIG. 13 illustrates a result of an operation simulation of the FF monitor circuit of FIG. 10.

FIG. 13 illustrates a result of an operation simulation of the FF monitor circuit 31 of FIG. 10. When the EN is set to a high level and the VDD is a high voltage, the output YFF0 of the replica circuit 33 and the output YFF1 of the malfunction circuit 34 alternately change between zero and one. Thus, the output Y of the comparator circuit 35 is at a low level (zero). When the VDD is gradually lowered and becomes lower than the first margin voltage, the output YFF0 of the replica circuit 33 still alternately change between zero and one, but the output YFF1 of the malfunction circuit 34 stops changing at a low level. Thus, the output Y of the comparator circuit 35 alternately changes between zero and one, and the warning signal Warning is produced.

As described above, the first margin voltage at which the malfunction circuit 34 normally operates is higher than the minimum operating voltage VDDmin at which the replica circuit 33 normally operates. Thus, the warning signal Warning is output (with a margin provided) before the replica circuit 33 does not normally operate.

Figure 14:
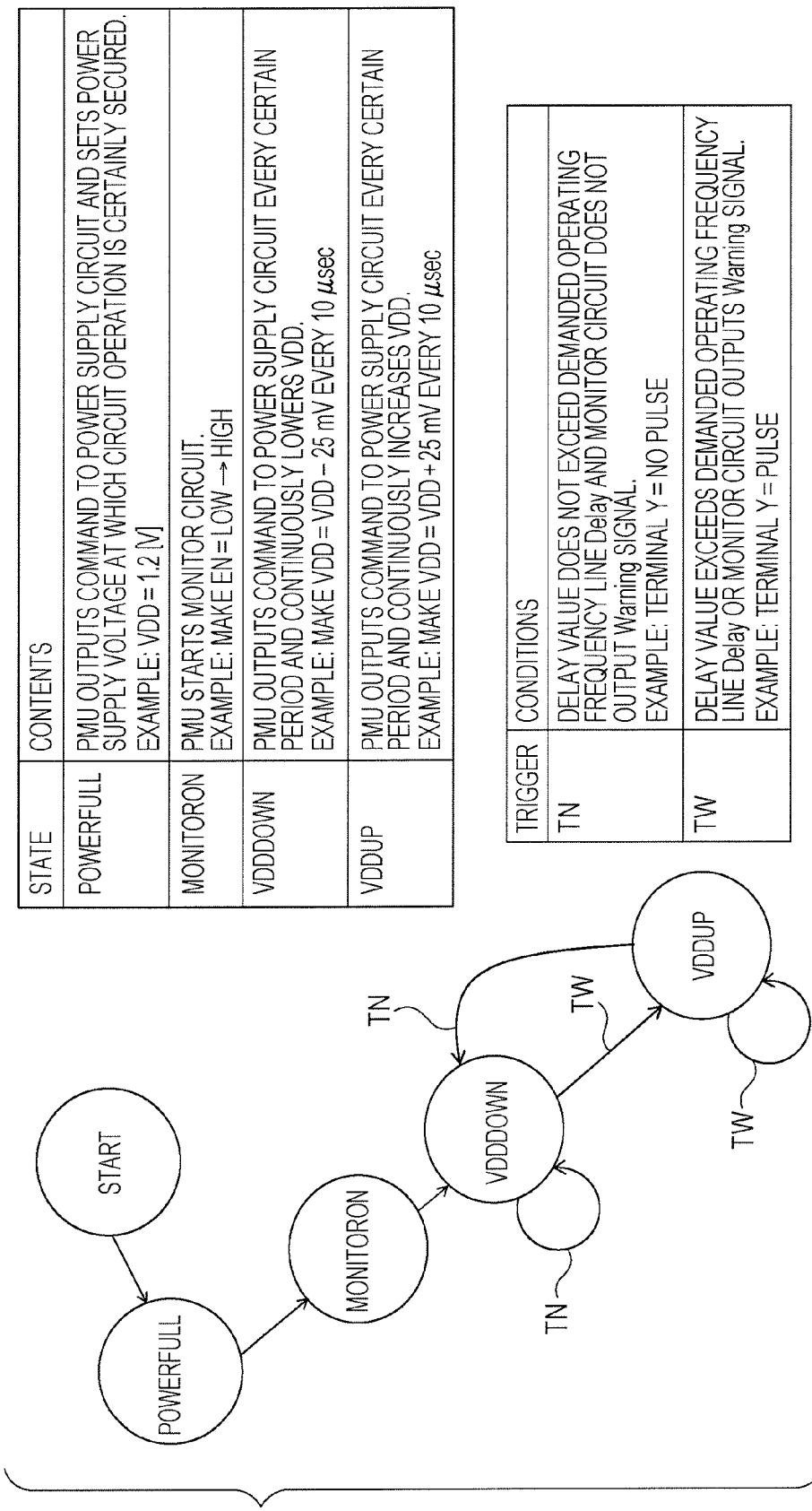
FIG. 14 is an operation state transition diagram that illustrates an operation sequence of the semiconductor device to which the AVS technology of the first embodiment is applied.

FIG. 14 is an operation state transition diagram that illustrates an operation sequence of the semiconductor device to which the AVS technology of the first embodiment is applied.

As illustrated in FIG. 14, the operation sequence starts from "START". States of "POWERFULL", "MONITORON", "VDDDOWN", and "VDDUP" are present, and the operation sequence transits among those.

In the "POWERFULL" state, the voltage of the VDD is set to a sufficiently high voltage that certainly secures an operation of an internal circuit of the circuit block 1 that includes the FF 2 and 4. For example, setting is made such that VDD=1.2 V. Accordingly, power management may be performed without malfunction of the circuit.

In the "MONITORON" state, the PMU 7 sets the EN at a high level (VDD) and starts the delay monitor circuit 5 and the FF monitor circuit 31.

In the "VDDDOWN" state, the PMU 7 repeatedly outputs a command to make the power supply 6 lower the VDD by a prescribed amount every certain period. For example, the PMU 7 outputs the command to make VDD=VDD−25 mV every 10μ, seconds. Here, the "VDDDOWN" state is maintained in a case of a trigger TN, and the state transits to the "VDDUP" state in a case of a trigger TW.

In the "VDDUP" state, the PMU 7 repeatedly outputs a command to make the power supply 6 increase the VDD by a prescribed amount every certain period. For example, the PMU 7 outputs the command to make VDD=VDD+25 mV every 10 μseconds. Here, the state transits to the "VDDDOWN" state in a case of the trigger TN, and the "VDDUP" state is maintained in a case of the trigger TW.

The trigger TN is output in a case where an output delay of the delay monitor circuit 5 does not exceed the demanded operating frequency line and the FF monitor circuit 31 does not output the warning signal Warning.

The trigger TW is output in a case where the output delay of the delay monitor circuit 5 exceeds the demanded operating frequency line or the FF monitor circuit 31 outputs the warning signal Warning.

Figure 15:
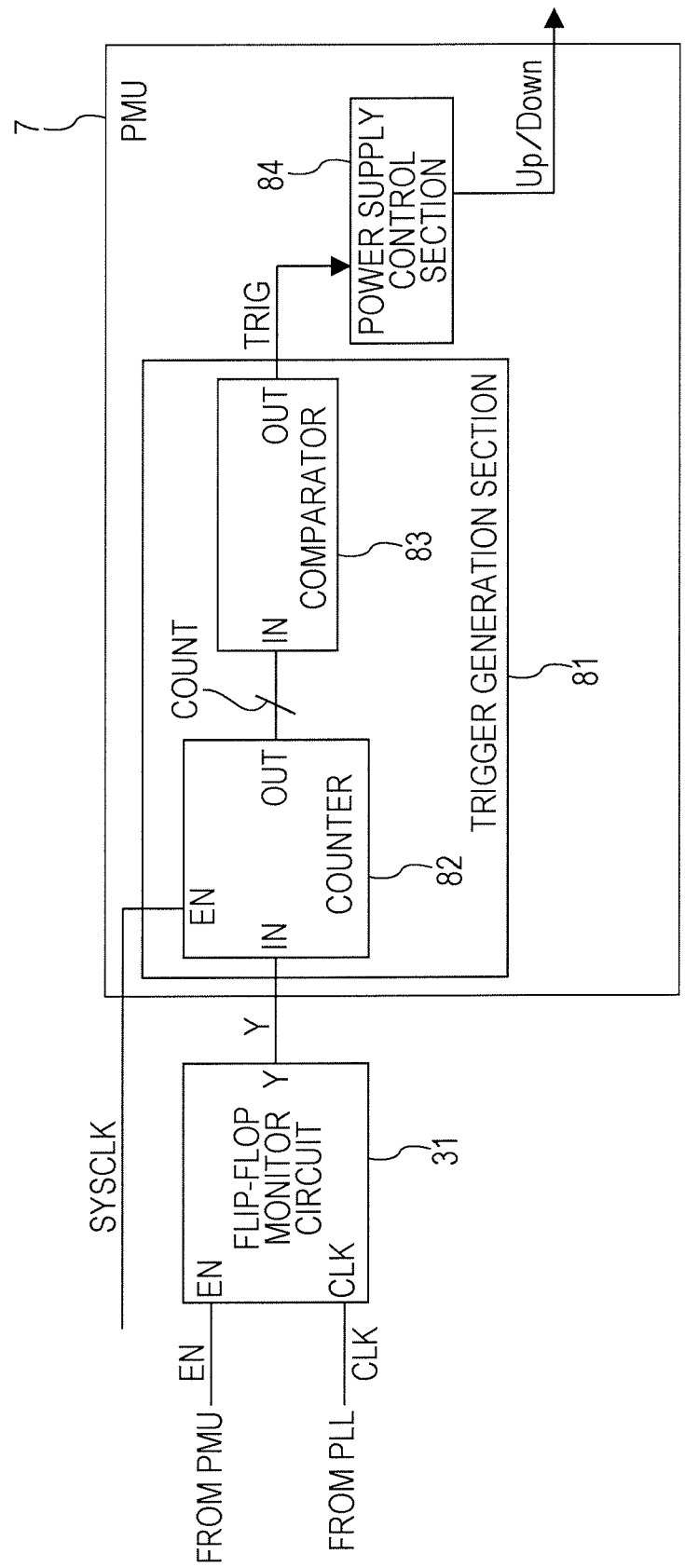
FIG. 15 is a block diagram that illustrates a circuit configuration of a power management unit (PMU)

FIG. 15 is a block diagram that illustrates a circuit configuration of the power management unit (PMU) 7.

The PMU 7 has a trigger generation section 81 and a power supply control section 84. The trigger generation section 81 has a counter 82 and a comparator 83. The counter 82 becomes the operation state while the system clock SYSCLK is at a high level and counts the warning signal Warning illustrated in FIG. 13 that is output by the FF monitor circuit 31. The comparator 83 outputs an internal trigger TRIG in a case where a count value of the counter 82 is large compared to a prescribed value. Accordingly, an influence of noise on the output Y of the FF monitor circuit 31 is canceled, and a determination of the warning signal Warning is certainly made.

A power supply control section 84 generates and outputs a control signal UP or Down of the power supply 6 that corresponds to the trigger TN or TW in FIG. 14 in accordance with the internal trigger TRIG.

Figure 16:
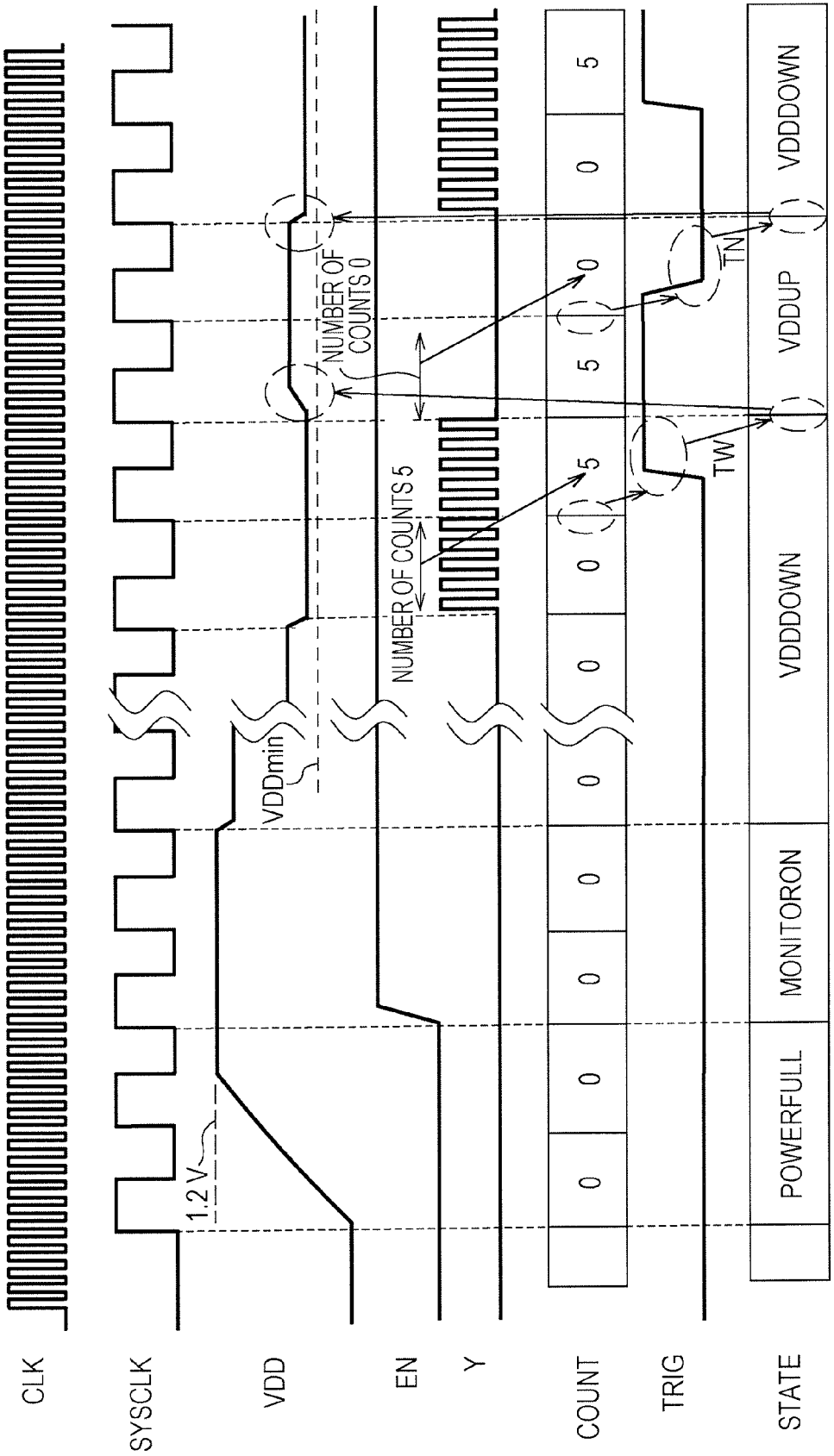
FIG. 16 is a timing diagram that illustrates an operation of the PMU.

FIG. 16 is a timing diagram that illustrates an operation of the power management unit (PMU) 7.

The VDD increases in the "POWERFULL" state and increases to a maximum value of 1.2 V, for example. During this, because the FF monitor circuit 31 is not in the operation state, the output Y of the FF monitor circuit 31 is at a low level, the count value that is output by the counter 82 is zero, and the TRIG that is output by the comparator 83 is at a low level.

In the "MONITORON" state, the PMU 7 turns the signal EN on (high), which makes the delay monitor circuit 5 and the FF monitor circuit 31 become the operation state. In response to this, the delay monitor circuit 5 measures and outputs the delay, and the FF monitor circuit 31 outputs an agreement detection result as the output Y. Because the VDD is 1.2 V and sufficiently high, the output Y of the FF monitor circuit 31 is at a low level, the count value that is output by the counter 82 is zero, and the TRIG that is output by the comparator 83 is at a low level.

Because the delay is lower than the limit line and the output Y of the FF monitor circuit 31 is at a low level, the state transits to "VDDDOWN", and the VDD is lowered by a unit amount. Repeating this leads to a decrease in the VDD. Although the delay that is output by the delay monitor circuit 5 increases as described above, a description will be made here on the assumption that the VDD becomes lower than the first margin voltage before the delay exceeds the demanded operating frequency line. When the VDD becomes lower than the first margin voltage, the malfunction circuit 34 of the FF monitor circuit 31 malfunctions, and the output Y of the FF monitor circuit 31 repeats an alternation between zero and one. In response to this, because the count value that is output by the counter 82 increases (becomes five here) and exceeds a reference value (for example, one), the TRIG becomes a high level, and the power supply control section 84 outputs a command Up that instructs to increase the VDD. In response to this, the state transits to "VDDUP", and the VDD is increased by the unit amount. Because the VDD increases, the output Y of the FF monitor circuit 31 is fixed to zero, the count value becomes zero, and the state thus transits to "VDDDOWN". Such an operation is repeated subsequently. Accordingly, control is made such that the VDD stays around the FF minimum operating voltage (in a range between slightly higher and lower voltages than the first margin voltage) without becoming lower than the FF minimum operating voltage.

The semiconductor device of the first embodiment is described in the above. In the first embodiment, the VDD is controlled based on both of the delay and the determination result of whether or not the FF is operable. Particularly, because the internal circuit of the circuit block 1 normally operates even when the operating frequency becomes low (for example, several hundred kHz or lower) and the delay is large, the VDD may be controlled to become a low voltage. In such a case, the FFs do not operate, and the semiconductor device does not normally operate. In the semiconductor device of the first embodiment, the VDD does not lower to a voltage at which the FFs do not operate. As described above, the first embodiment provides an AVS power management technology with high reliability.

In the semiconductor device of the first embodiment, as illustrated in FIG. 16, the state frequently transits between "VDDDOWN" and "VDDUP". Thus, a ripple (small voltage fluctuation) arises on the VDD that is supplied to the circuit block 1. This is not preferable in terms of a stable operation of the circuit block 1.

In a second embodiment that will next be described, a frequent fluctuation in the VDD is reduced.

Figure 17:
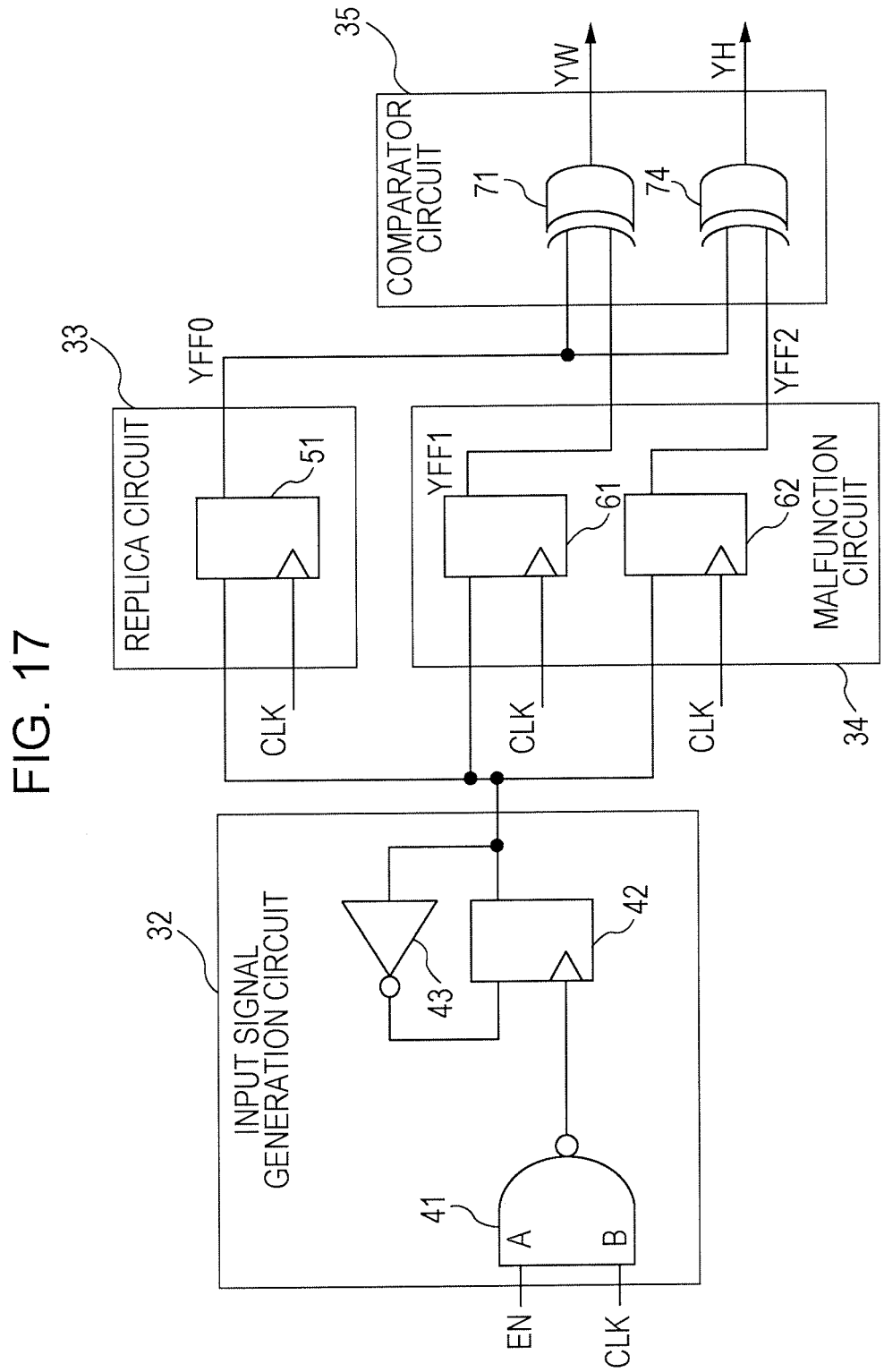
FIG. 17 illustrates a circuit configuration of an FF monitor circuit of a semiconductor device of a second embodiment.

FIG. 17 illustrates a circuit configuration of the FF monitor circuit 31 of a semiconductor device of the second embodiment. The FF monitor circuit 31 of FIG. 17 corresponds to the FF monitor circuit 31 of FIG. 10. The semiconductor device of the second embodiment is different from the first embodiment in a point that the FF monitor circuit 31 is different and the PMU 7 performs control in consideration of other signals that are output by the FF monitor circuit 31, but the other features are the same.

In the FF monitor circuit 31 of the second embodiment, the malfunction circuit 34 has the FF 62 in addition to the FF 61. The FF 62 latches an input signal synchronously with the internal clock CLK and outputs the signal as YFF2 but malfunctions when the VDD becomes lower than a second margin voltage that is higher than the first margin voltage. In other words, the FF 62 malfunctions prior to the FF 61 in a case where the VDD is lowered.

In addition, in the FF monitor circuit 31 of the second embodiment, the comparator circuit 35 has an EXOR 74 in addition to the EXOR 71. The EXOR 74 detects agreement between YFF0 that is output by the FF 51 and an output of the FF 62 and outputs a detection result as a hold signal YH. The EXOR 71 outputs a comparison result as the warning signal YW.

The FF 62 of FIG. 17 that malfunctions when the VDD becomes lower than the second margin voltage that is higher than the first margin voltage is implemented by setting resistance values of the resistor R1 in FIG. 12A, a resistor R2 in FIG. 12B, and resistors R3 and R4 in FIG. 12C to larger values, for example.

Figure 18:
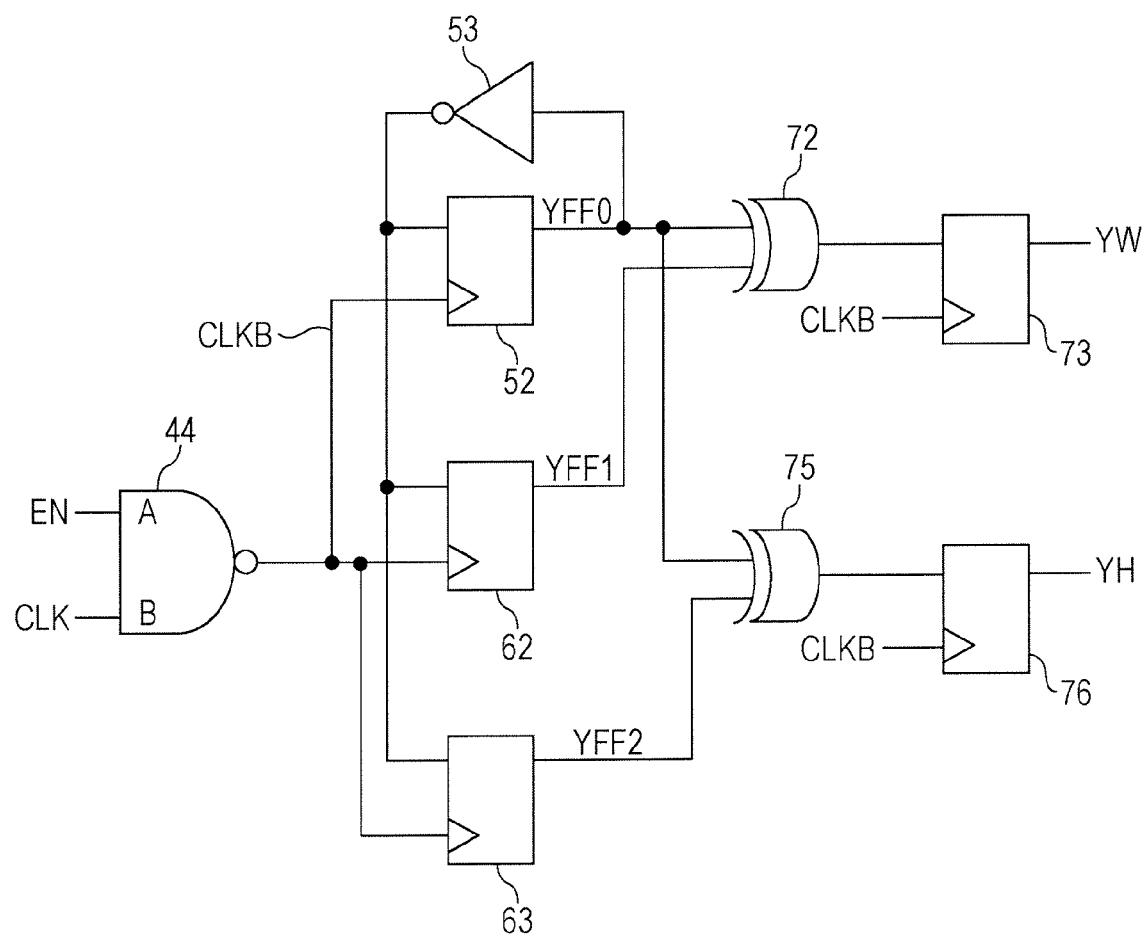
FIG. 18 illustrates another circuit configuration of the FF monitor circuit of the semiconductor device of the second embodiment.

FIG. 18 illustrates another circuit configuration of the FF monitor circuit 31 of the semiconductor device of the second embodiment. The FF monitor circuit 31 of FIG. 18 corresponds to the FF monitor circuit 31 of FIG. 11.

The FF monitor circuit 31 of FIG. 18 has an FF 63, an EXOR 75, and an FF 76 in addition to the NAND gate 44, the FF 52, the inverter 53, the FF 62, the EXOR 72, and the FF 73. The FF monitor circuit 31 of FIG. 18 is a FF monitor circuit that is simplified from the FF monitor circuit 31 of FIG. 17 similarly to FIG. 11, and a description thereof will not be made. The FF 73 outputs the warning signal YW, and the FF 76 outputs the hold signal YH. Further, the FF monitor circuit 31 of FIG. 18 is used in a similar manner to the FF monitor circuit 31 of FIG. 17. Thus, a case where the FF monitor circuit 31 of FIG. 17 is used will be described in a description made below.

Figure 19:
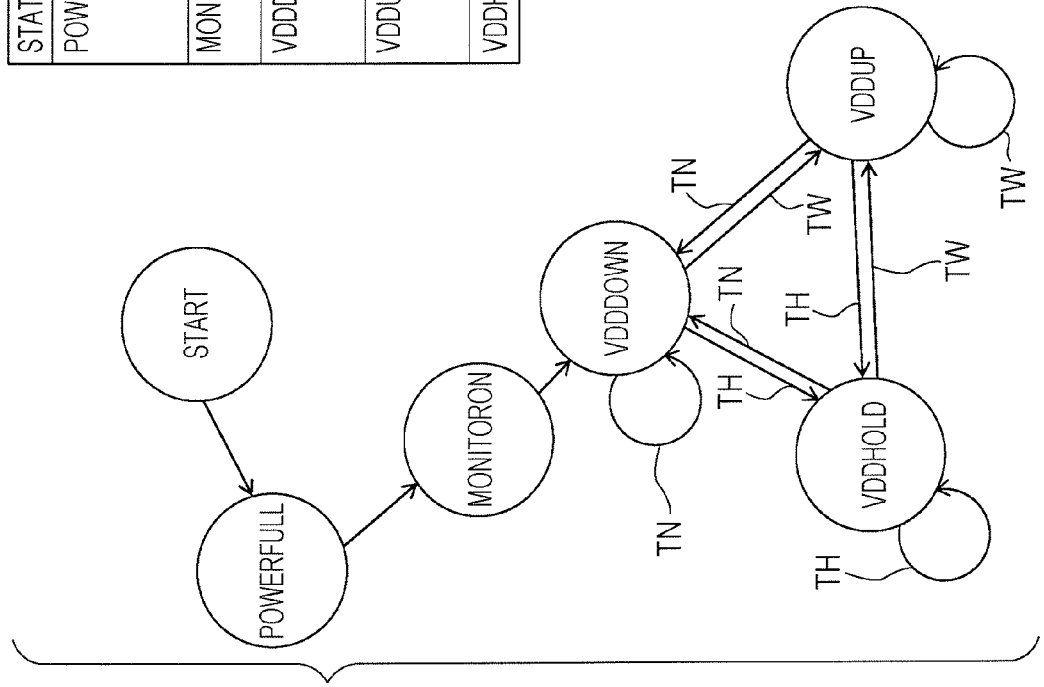
FIG. 19 is an operation state transition diagram that illustrates an operation sequence of the semiconductor device to which the AVS technology of the second embodiment is applied.

FIG. 19 is an operation state transition diagram that illustrates an operation sequence of the semiconductor device to which the AVS technology of the second embodiment is applied.

As it is clear from a comparison with FIG. 14, the operation state transition diagram of the second embodiment is different from the first embodiment in a point that a "VDDHOLD" state and a trigger TH are added, but the other features are the same. Accordingly, the difference will be described.

A value of the VDD is maintained in the "VDDHOLD" state. The trigger TH is output in a case where the output delay of the delay monitor circuit 5 does not exceed the demanded operating frequency line and the FF monitor circuit 31 outputs the hold signal YH. Specifically, the trigger TH is output in a case where a pulse is not output in the output YW of the FF monitor circuit 31 but the pulse is output in the output YH.

In "VDDHOLD", the state is maintained when the trigger TH is output. The state transits to "VDDDOWN" when the trigger TN is output, and the state transits to "VDDUP" when the trigger TW is output.

In "VDDDOWN", the state is maintained when the trigger TN is output. The state transits to "VDDHOLD" when the trigger TH is output, and the state transits to "VDDUP" when the trigger TW is output.

In "VDDUP", the state is maintained when the trigger TW is output. The state transits to "VDDHOLD" when the trigger TH is output, and the state transits to "VDDDOWN" when the trigger TN is output.

Figure 20:
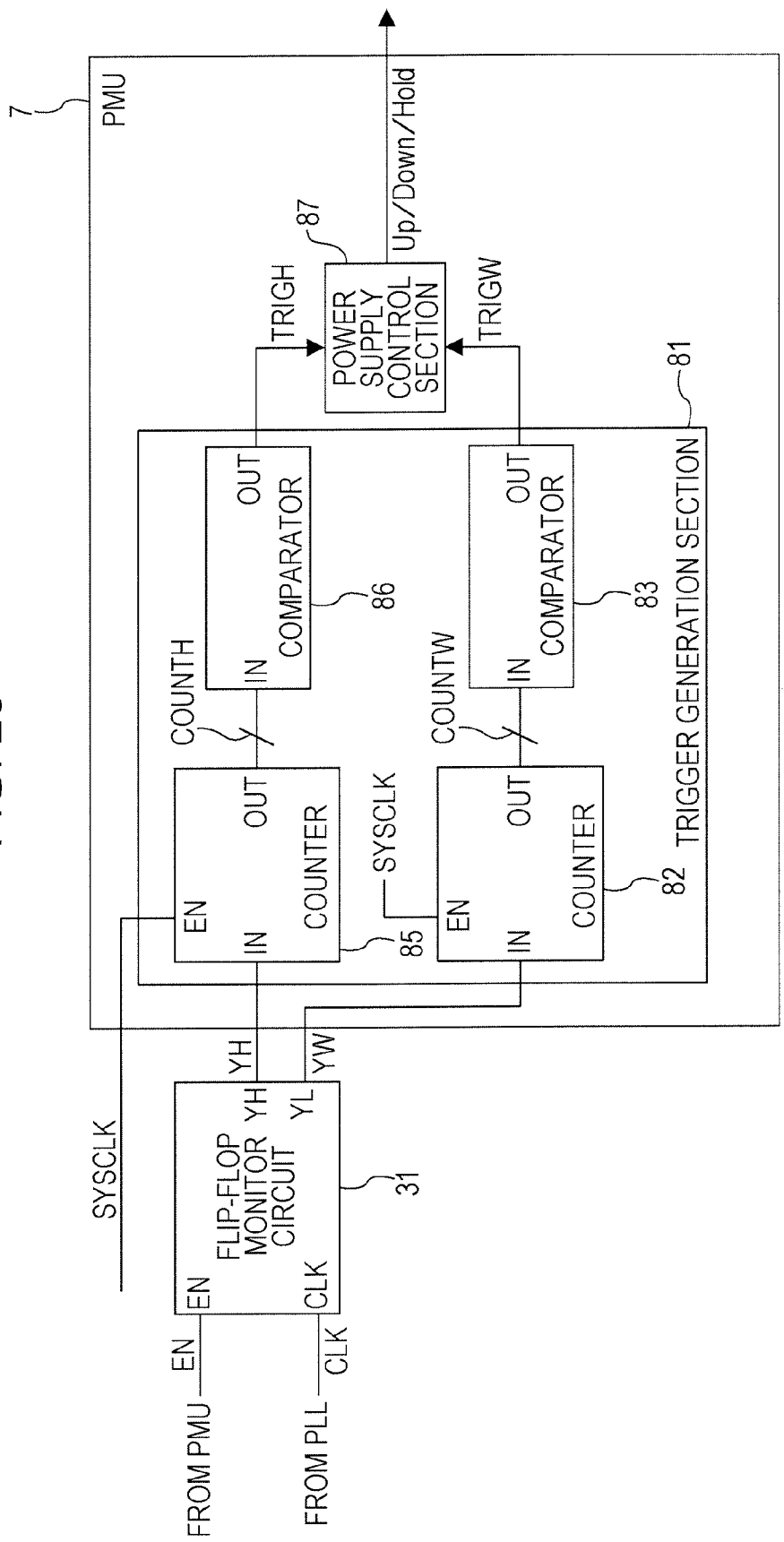
FIG. 20 is a block diagram that illustrates a circuit configuration of a power management unit (PMU) of the semiconductor device of the second embodiment.

FIG. 20 is a block diagram that illustrates a circuit configuration of the power management unit (PMU) 7 of the semiconductor device of the second embodiment.

The PMU 7 of the second embodiment is different from the first embodiment in a point that the trigger generation section 81 further has a counter 85 and a comparator 86, and a power supply control section 87 generates control signals Up, Down, and Hold of the power supply 6 from outputs of the comparators 83 and 86. The other features are the same as the first embodiment.

The counter 85 is different only in a point that the output YH of the FF 76 is input, and the other features are the same as those of the counter 82. The comparator 86 is the same as the comparator 83. An output of the comparator 83 is referred to as TRIGW, and an output of the comparator 86 is referred to as TRIGH. Thus, when the pulse occurs in the output YH of the FF 74, the TRIGH becomes a high level.

The power supply control section 87 generates the control signals Up, Down, and Hold of the power supply 6 while following the sequence illustrated in FIG. 19 based on the TRIGW and TRIGH.

Figure 21:
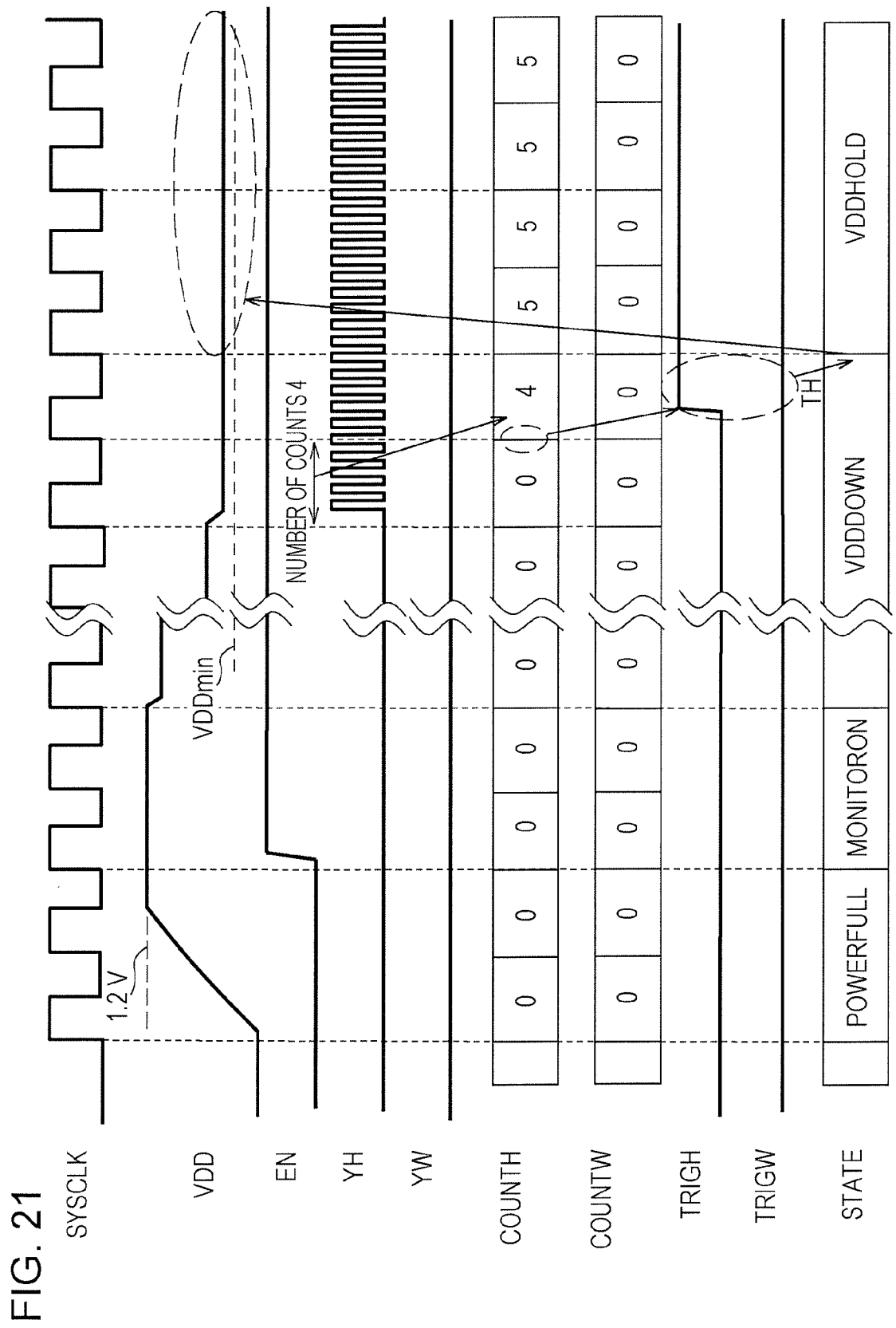
FIG. 21 is a timing diagram that illustrates an operation of the PMU of the second embodiment.
Figure 22:
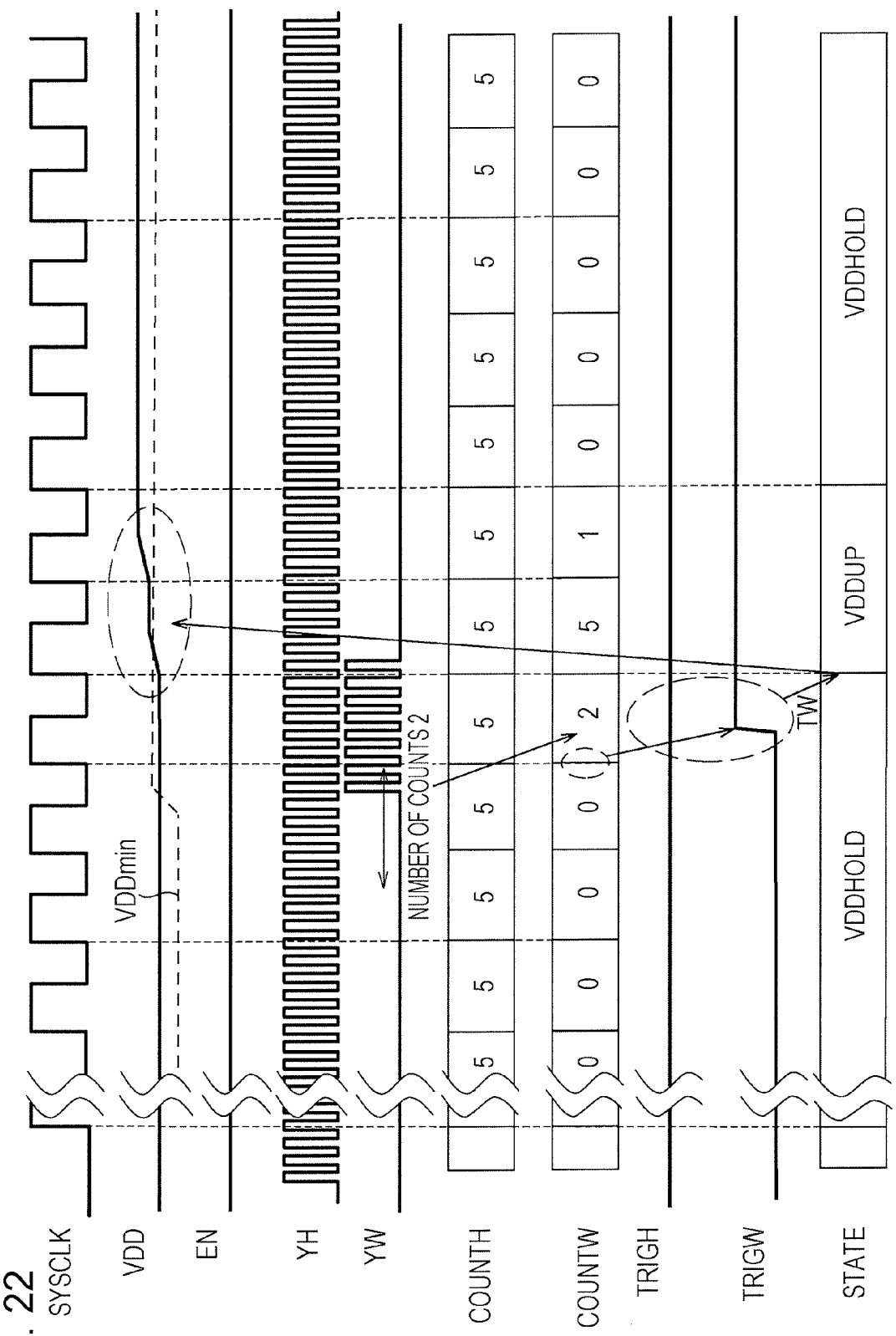
FIG. 22 is a timing diagram that illustrates the operation of the PMU of the second embodiment.

FIGS. 21 and 22 are timing diagrams that illustrate the operation of the power management unit (PMU) 7 of the second embodiment.

The sequence from the start to the transition to "VDDDOWN" is the same as the first embodiment in FIG. 16, and a description thereof will not be made.

The VDD is lowered by the unit amount in "VDDDOWN". Repeating this leads to a decrease in the VDD. Although the delay that is output by the delay monitor circuit 5 increases as described above, it is assumed here that the VDD exceeds the second margin voltage and the first margin voltage before the delay exceeds the demanded operating frequency line. In response to this, the FF 62 of the malfunction circuit 34 malfunctions, and the output YH of the FF monitor circuit 31 repeats an alternation between zero and one. In response to this, because a count value COUNTH that is output by the counter 85 increases (becomes four here) and exceeds a reference value (for example, two), the TRIGH becomes a high level. During this, the FF 61 of the malfunction circuit 34 normally operates, the output YW of the FF monitor circuit 31 is maintained at a low level, a count value COUNTW of the counter 82 is zero, and the TRIGW is maintained at a low level. Thus, the power supply control section 84 outputs a command HOLD that instructs to maintain the VDD. In response to this, the state transits to "VDDHOLD". Because a voltage value VDD is thereafter maintained, the output YH repeats an alternation between zero and one, and the TRIGH thus maintains a high level. The output YW is maintained at a low level, and the TRIGW thus maintains a low level. Accordingly, the state is maintained in "VDDHOLD", the power supply control section 84 outputs the command HOLD that instructs to maintain the VDD, and the VDD thus does not change. As described above, the VDD is stable, and the ripple does not arise on the VDD.

As illustrated in FIG. 22, it is assumed that the minimum operating voltage VDDmin increases for some reason (for example, a temperature increase) and the VDD becomes lower than the VDDmin. In this case, the FF 61 of the malfunction circuit 34 also malfunctions, and the output YW of the FF monitor circuit 31 repeats an alternation between zero and one. In response to this, because a count value COUNTW that is output by the counter 82 increases (becomes two here) and exceeds a reference value (for example, one), the TRIGW becomes a high level.

During this, the FF 62 of the malfunction circuit 34 still malfunctions, the output YH of the FF monitor circuit 31 repeats an alternation between zero and one, the count value COUNTH is equal to or greater than a reference value (five here), and the TRIGH becomes a high level. Thus, the power supply control section 84 outputs the command Up that instructs to increase the VDD. In response to this, the state transits to "VDDUP", and the VDD is increased by the unit amount. Because the VDD increases, the output YW of the FF monitor circuit 31 becomes a low level, the count value becomes zero, and the state thus transits to "VDDHOLD". Such an operation is repeated subsequently. Accordingly, the VDD is stably maintained between the first margin voltage and the second margin voltage and is controlled to return to a range between the first margin voltage and the second margin voltage in cases where the VDD becomes lower than the first margin voltage and higher than the second margin voltage.

The first and second embodiments are described in the above. However, it is matter of course that various modifications are possible. For example, a description is made with examples where the monitor circuit that uses the flip-flop (FF) in the first and second embodiments. However, a circuit element that includes the FF is used, and whether or not the circuit block 1 is a power supply that malfunctions may thereby be monitored.

Figure 23:
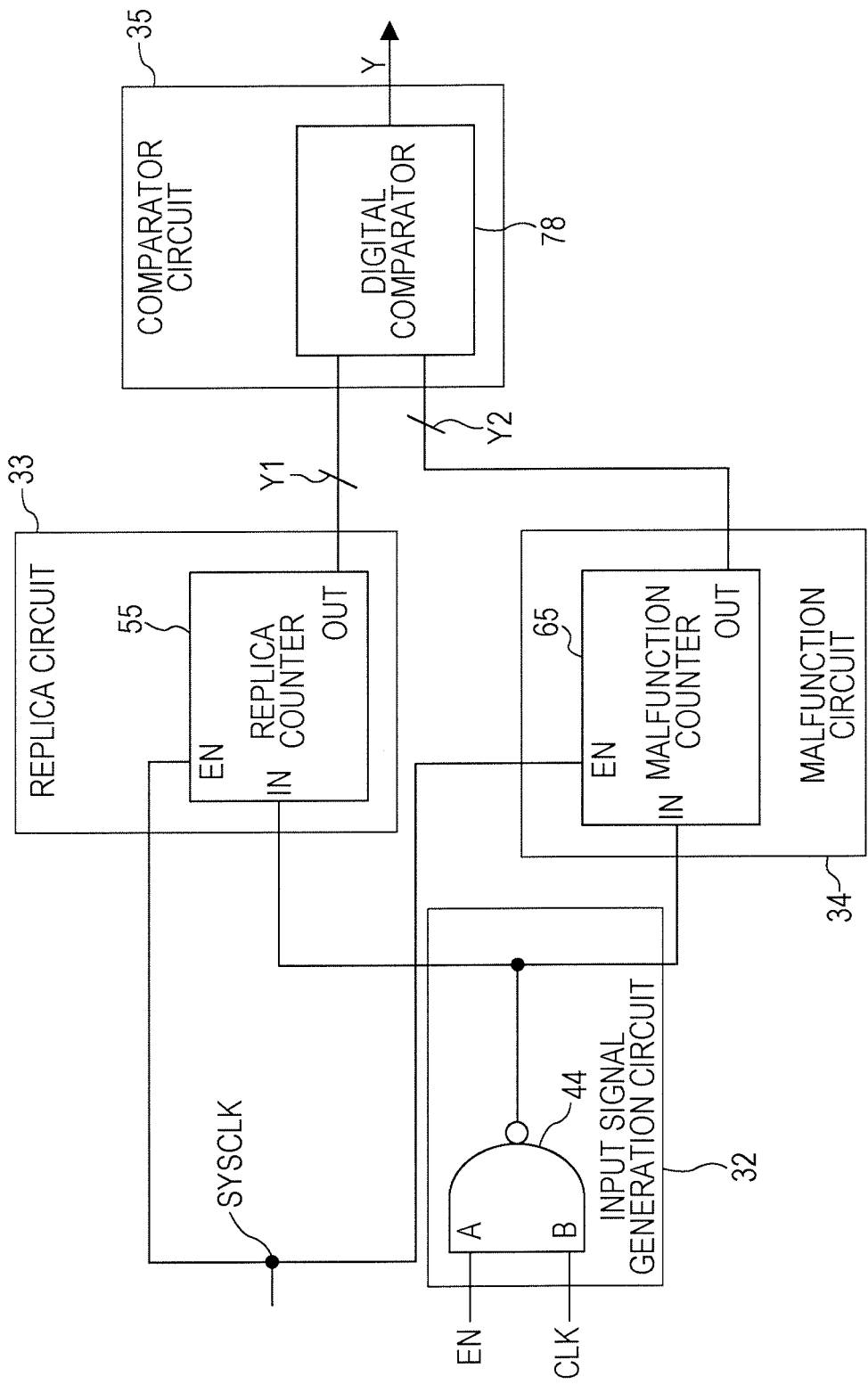
FIG. 23 illustrates a modification example of the FF monitor circuit.

FIG. 23 illustrates a modification example of the flip-flop (FF) monitor circuit 31.

The FF monitor circuit 31 has the input signal generation circuit 32, the replica circuit 33, the malfunction circuit 34, and the comparator circuit 35. The input signal generation circuit 32 has the NAND gate 44. The NAND gate 44 allows the internal clock to pass through when the control signal EN from the PMU 7 is at a high level and blocks the internal clock when the EN is at a low level.

The replica circuit 33 has a replica counter 55 that includes an FF that has the same circuit configuration and properties as the FF that is used in the circuit block 1 illustrated in FIG. 5A and outputs a counter value Y1. The malfunction circuit 34 has a malfunction counter 65 that includes the same FF as the FF used in the circuit block 1, similarly to the replica counter 55 that is used in the replica circuit 33. However, the malfunction circuit 34 includes an FF that malfunctions when the power supply voltage VDD becomes lower than the first margin voltage. The malfunction counter 65 outputs a count value Y2. The FF included in the malfunction counter 65 is implemented as illustrated in FIG. 12, for example. In other words, the malfunction circuit 34 malfunctions (miscounts) at a higher voltage than a voltage at which the replica circuit 33 malfunctions (miscounts).

The comparator circuit 35 includes a digital comparator 78 that determines whether or not the count value Y1 that is output by the replica circuit 33 agrees with the count value Y2 that is output by the malfunction circuit 34. Because the same signal is input to the two counters of the replica circuit 33 and the malfunction circuit 34 from the input signal generation circuit 32, the count values are the same in a case where both of the replica circuit 33 and the malfunction circuit 34 normally operate. Accordingly, the comparator circuit 35 detects agreement. If the output Y of the comparator circuit 35 indicates disagreement, a determination is made that one of the replica circuit 33 and the malfunction circuit 34 malfunctions and miscounts and specifically the malfunction circuit 34 that malfunctions at the higher VDD miscounts (malfunctions).

Figure 24A:
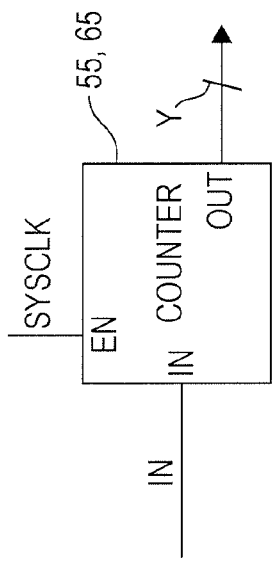
Figure 24B:
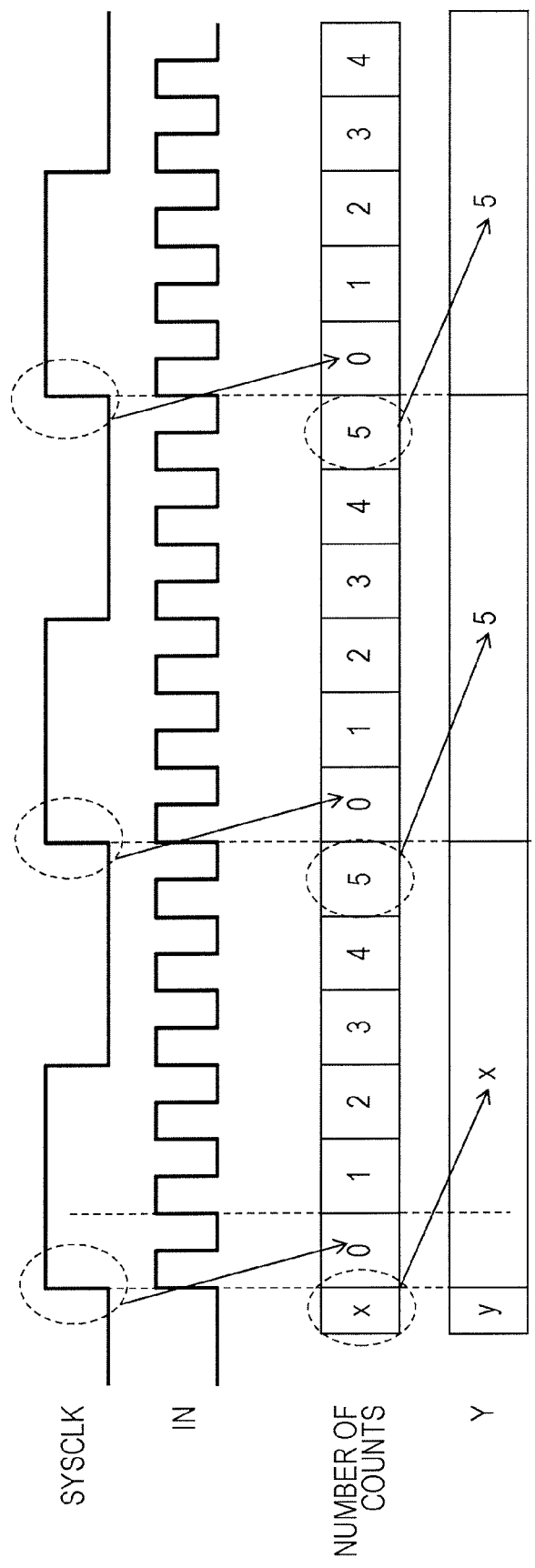

FIG. 24 illustrates input and output signals and an operation of the replica counter 55 and the malfunction counter 65, in which FIG. 24A illustrates the input and output signals and FIG. 24B is a timing diagram that illustrates an operation.

As illustrate in FIG. 24A, the counter counts the number of pulses of a pulse signal that is input from a terminal IN. The counter takes in the count value and outputs that as Y from an OUT terminal at a rise of the system clock SYSCLK that is input to the EN terminal and resets an accumulated count value.

As illustrated in FIG. 24B, the replica counter 55 and the malfunction counter 65 count the numbers of pulses of an input signal IN that has five pulses in one period of the SYSCLK and output the numbers of pulses as Y1 and Y2 synchronously with a rise of SYSCLK. In a case where the replica counter 55 and the malfunction counter 65 normally operate, Y1=Y2=5.

As described above, the FF monitor circuit may be formed by using the circuit element that includes the FF such as the counter. A large number of various circuit elements that include the FF are used in the circuit block 1, and the FF monitor circuit may be implemented by using any of the circuit elements.

The configuration example where the FF is implemented that malfunctions when the power supply voltage VDD included in the malfunction circuit 34 becomes lower than the first margin voltage is illustrated in FIG. 12. However, various kinds of implementing methods are present other than that, and a modification example will be described below.

FIG. 25 illustrates a modification example of the FF that malfunctions when the power supply voltage VDD becomes lower than the first margin voltage.

Figure 25B:
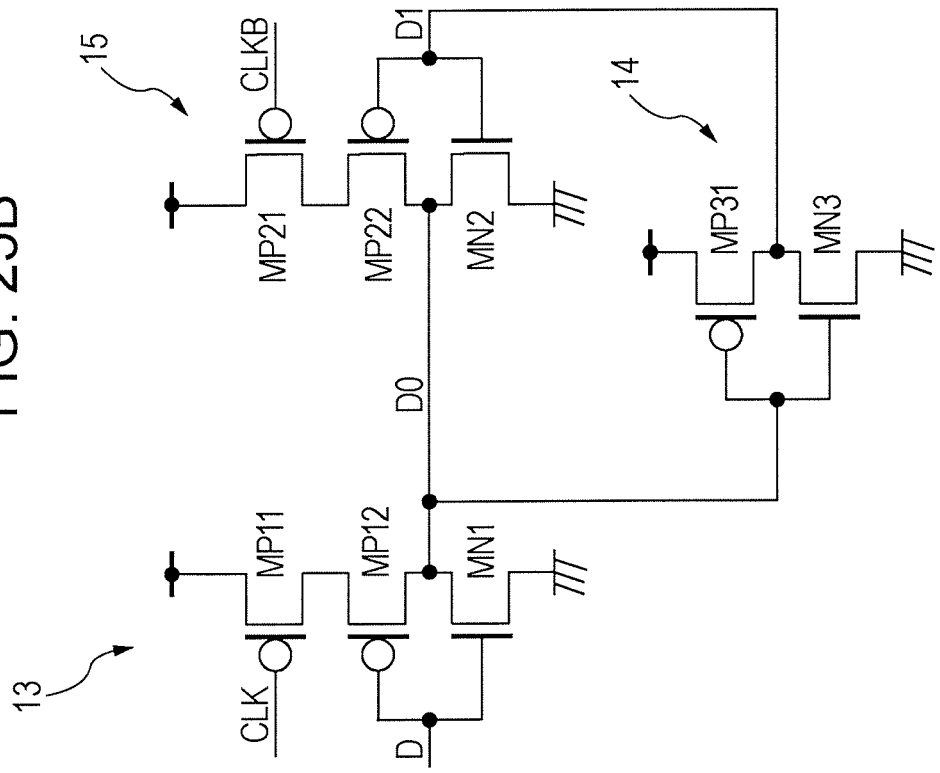
FIG. 25A-25B illustrate a modification example of an FF that malfunctions when the power supply voltage VDD becomes lower than a first margin voltage.
Figure 25A:
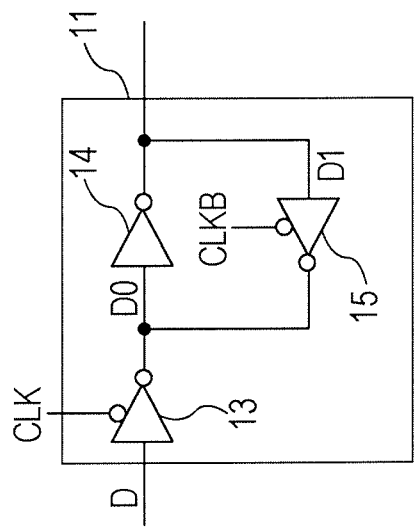

FIG. 25A illustrates a master section 11 of the tri-state based FF (TBFF) that is illustrated in FIG. 5. In this modification example, a gate width of a portion of the transistors of the inverters 13 and 15 of a master section 11 is changed, and malfunction thereby occurs when the power supply voltage VDD becomes lower than the first margin voltage. A similar modification may be applied to a slave section 12 or the master section 11 and the slave section 12.

FIG. 25B illustrates the master section 11 of FIG. 25A in a scale of transistors, and portions that are indicated by reference numerals 13 to 15 correspond to the inverters 13 to 15. The inverter 13 has PMOS transistors MP11 and MP12 that are serially connected between the VDD and the GND and an NMOS transistor MN1. The inverter 15 has PMOS transistors MP21 and MP22 that are serially connected between the VDD and the GND and an NMOS transistor MN2. The inverter 14 has a PMOS transistor MP31 that is serially connected between the VDD and the GND and an NMOS transistor MN3. Wiring is as illustrated by the drawing and has been widely known, and a description thereof will thus not be made.

In the modification example, in FIG. 25B, gate widths of the PMOS transistors MP11 of the inverter 13 and the PMOS transistor MP21 of the inverter 15 are made much narrower than the FF that is used in the circuit block 1. Gate widths of the other transistors MP12, MP22, MP31, MN1, MN2, and MN3 are made the same as the FF that is used in the circuit block 1. Accordingly, resistances become high when the MP11 and MP12 are turned on, and amplitudes of signals D0 and D1 are likely to be insufficient, thus providing an FF that is likely to malfunction.

Figure 26:
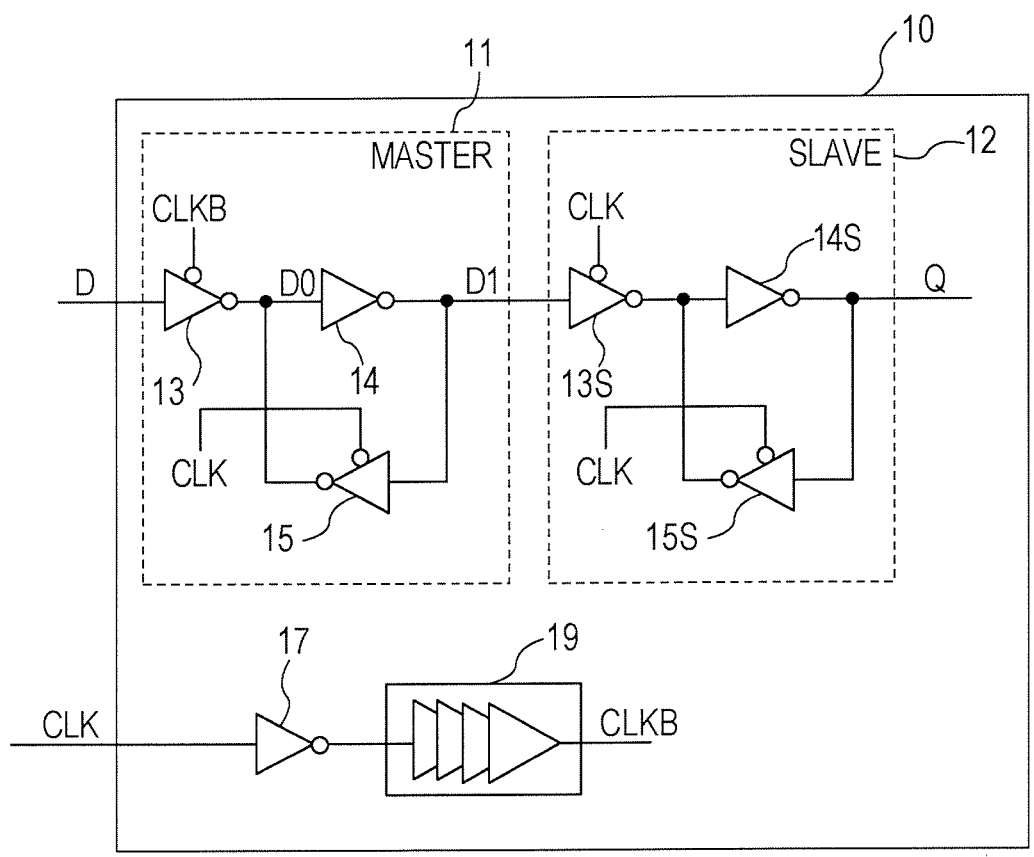
FIG. 26 illustrates another modification example of the FF that malfunctions when the power supply voltage VDD becomes lower than the first margin voltage.

FIG. 26 illustrates another modification example of the FF that malfunctions when the power supply voltage VDD becomes lower than the first margin voltage.

An FF 10 of FIG. 26 is a tri-state based FF (TBFF) and has the master section 11 and the slave section 12 in the same configuration and a clock generation section. The master section 11 and the slave section 12 are the same except the fact that a clock is half a period offset with respect to the FF of FIG. 5A and similarly operate. The clock generation section has an inverter 17 and a delay circuit 19 and generates an inverted clock CLKB from the internal clock. As illustrated in FIG. 5B, a usual FF that is used in the circuit block 1 is not provided with the delay circuit 19, and an output itself of the inverter 17 becomes the CLKB. In other words, in the FF of FIG. 26, the inverted clock CLKB is delayed with respect to a usual case, and a time in which the CLK and the CLKB retain the same states (zero and one) becomes long. Thus, the input signal D0 of the inverter 14 becomes unstable, providing the FF that is likely to malfunction.

The method that facilitates malfunction by delaying the signal and is illustrated in FIG. 26 may be applied in other manners. For example, in FIG. 11, an output of the inverter 53 is input to the FF 52 without a delay, similarly to a usual manner, but is input to the FF 62 with a delay, thereby facilitating malfunction of the FF 62.

The first and second embodiments are described in the above. However, it is matter of course that various modifications are possible. For example, in the first and second embodiments and the modification examples, a description is made with the tri-state based FF (TBFF) as an example. However, an FF of another type may be used.

The embodiments have been described in the foregoing. However, all the examples and conditions described herein are described for the purpose of aiding understanding the concept of the disclosure which is applied to disclosures and technologies. The particularly described examples and conditions are not intended to limit the scope of the present disclosure, and the configurations of such examples of this specification do not represent advantages or disadvantages of the disclosure. The embodiments of the disclosure have been described in detail. However, it is understood that changes, substitutions, and modifications may be made without departing from the gist and the scope of the disclosure.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A semiconductor device comprising:
a power supply;
a circuit block that has at least one storage element and operates by receiving a power supply voltage from the power supply;
a power management unit that controls the power supply to change the power supply voltage; and
a storage element monitor circuit that generates and transmits to the power management unit a first malfunction signal at a first margin voltage that is higher than a voltage at which the storage element does not normally operate in a case where the power supply voltage lowers, wherein the power management unit controls the power supply based on the first malfunction signal so that the power supply voltage does not become lower than the first margin voltage.

2. The semiconductor device according to claim 1, wherein the storage element monitor circuit has at least one first malfunction element that malfunctions at the first margin voltage and generates a first malfunction precautionary detection signal in a case where the storage element normally operates and the first malfunction element does not normally operate.

3. The semiconductor device according to claim 2, wherein the storage element monitor circuit has at least one second malfunction element that malfunctions at a second margin voltage that is higher than the first margin voltage and generates a second malfunction precautionary detection signal in a case where the second malfunction element does not normally operate.

4. The semiconductor device according to claim 3, wherein the power management unit controls the power supply to lower the power supply voltage by a unit amount in a case where the power management unit does not receive the first malfunction precautionary detection signal or the second malfunction precautionary detection signal, to maintain the power supply voltage in a case where the power management unit does not receive the first malfunction precautionary detection signal and receives the second malfunction precautionary detection signal, and to increase the power supply voltage by a unit amount in a case where the power management unit receives the first malfunction precautionary detection signal.

5. The semiconductor device according to claim 1, wherein the power management unit sets the power supply voltage to a voltage at which the circuit block and the storage element do not malfunction in a start of an operation.

6. The semiconductor device according to claim 2, wherein the first malfunction element has a same structure as the storage element and is connected to the power supply via a resistor of a higher resistance value than the storage element.

7. The semiconductor device according to claim 3, wherein the second malfunction element has a same structure as the storage element and is connected to the power supply via a resistor of a resistance value that is higher than a connection resistance of the storage element to the power supply and a connection resistance of the first malfunction element to the power supply.

8. The semiconductor device according to claim 1, further comprising:
    an operation monitor circuit that has a delay path in which a delay increases in a case where the power supply voltage lowers and generates an operation limit signal in a case where the delay of the delay path exceeds a prescribed value,
    wherein the power management unit controls the power supply to increase power supply voltage by the unit amount in a case where the operation limit signal is produced in lowering the power supply voltage by the unit amount.

9. The semiconductor device according to claim 1, wherein the at least one storage element is a flip-flop.

* * * * *